United States Patent [19]

Azuma

[11] Patent Number: 5,325,325
[45] Date of Patent: Jun. 28, 1994

[54] SEMICONDUCTOR MEMORY DEVICE CAPABLE OF INITIALIZING STORAGE DATA

[75] Inventor: Daisuke Azuma, Kyoto, Japan

[73] Assignee: Sharp Kabushiki Kaisha, Osaka, Japan

[21] Appl. No.: 673,532

[22] Filed: Mar. 22, 1991

[30] Foreign Application Priority Data

Mar. 30, 1990 [JP] Japan ................................. 2-87055
Aug. 31, 1990 [JP] Japan ................................. 2-231647

[51] Int. Cl.$^5$ ............................................ G11C 11/00
[52] U.S. Cl. ..................................... 365/156; 365/149
[58] Field of Search ......................... 365/154, 156, 149

[56] References Cited

U.S. PATENT DOCUMENTS

| | | | |
|---|---|---|---|
| 3,757,313 | 9/1973 | Hines et al. | 365/154 |
| 4,852,061 | 7/1989 | Baron et al. | 365/154 |
| 4,935,896 | 6/1990 | Matsumura et al. | 365/149 |
| 5,121,353 | 6/1992 | Natori | 365/149 |

*Primary Examiner*—Robert Limanek

[57] ABSTRACT

An SRAM is provided wherein each memory cell has first and second storage nodes to be maintained at complementary potentials corresponding to storage data and first and second inverters provided in anti-parallel between the first storage node and the second storage node. Also, a DRAM is provided wherein each memory cell has a single storage node to be maintained at a potential corresponding to storage data and a capacitor provided between the storage node and a low potential source. In each of predetermined memory cells in which storage data is to be initialized, an MOS transistor, which is controlled to turn on for a fixed time period at the time of power supply, is connected between a potential source capable of supplying a potential corresponding to the initialization data and at least one of the first and the second storage nodes (in the case of the SRAM) or between the potential source and the single storage nodes (in the case of the DRAM). In the case of the SRAM, the first or the second inverter in each of the predetermined memory cells is replaced by a two-input NAND gate or a two-input NOR gate for which the output potential at the time of the power supply is controlled to correspond to the initialization data irrespective of the potential at the first (or the second) storage node.

49 Claims, 17 Drawing Sheets

FIG. 2
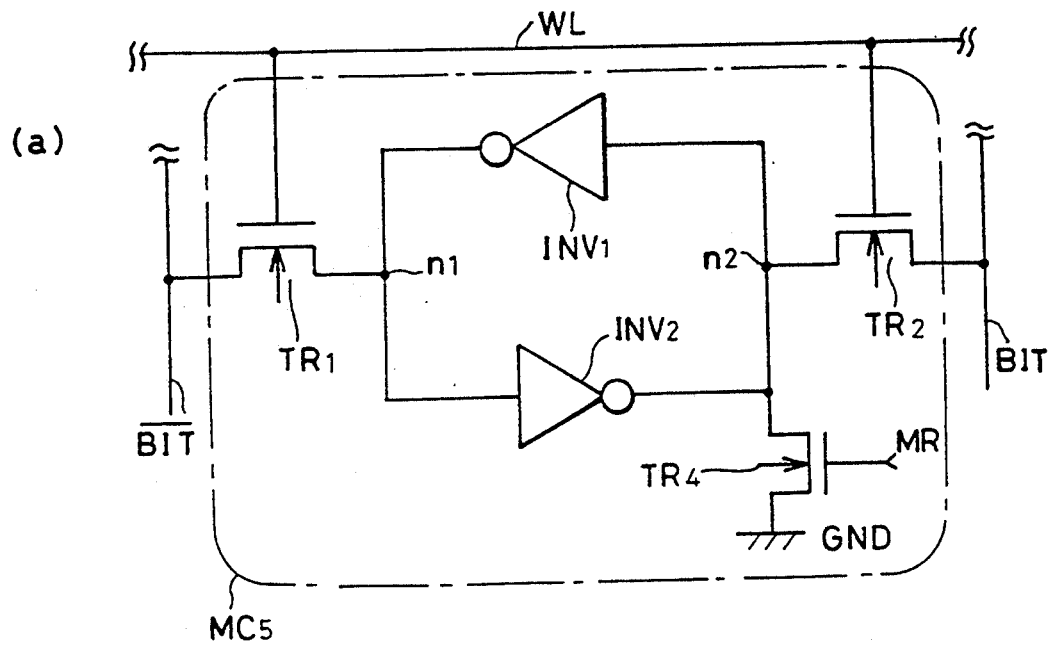
(a)
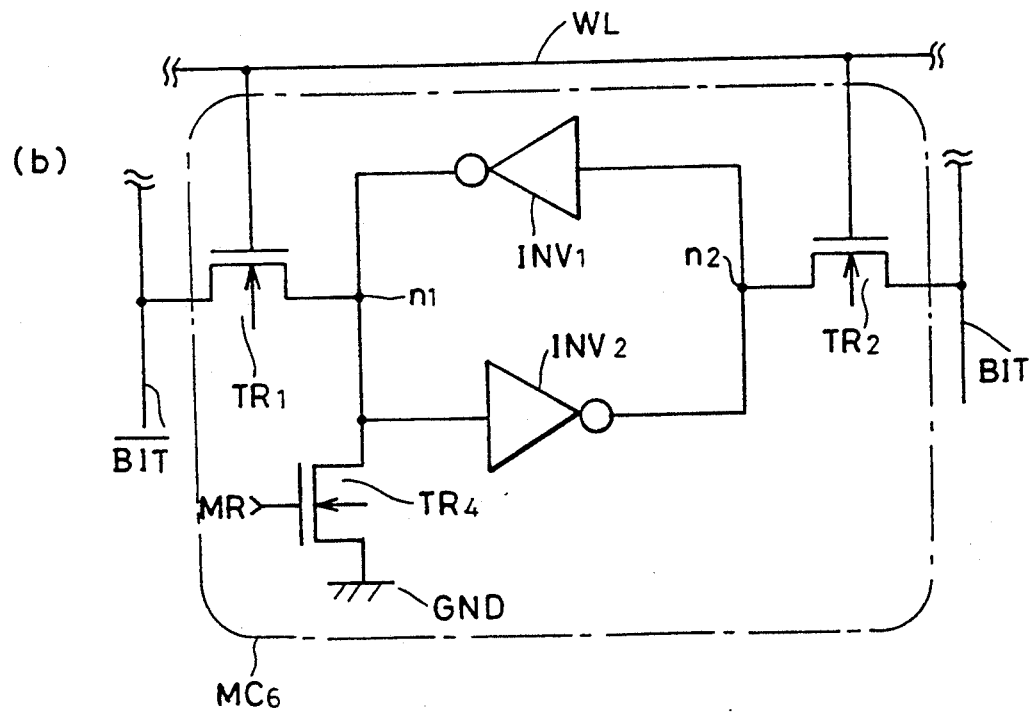
(b)

FIG. 3
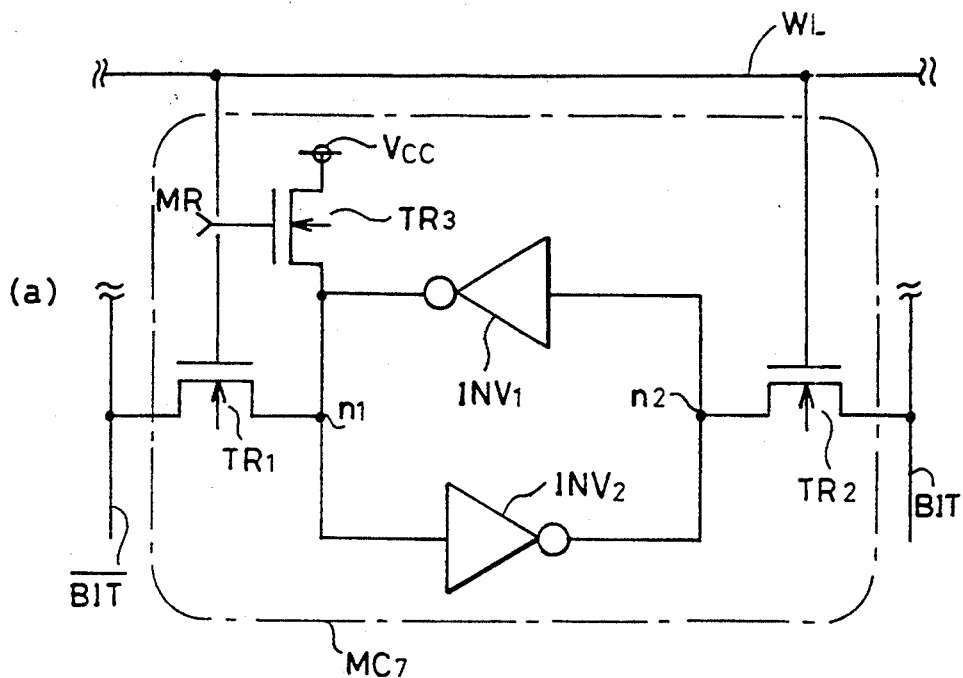
(a)
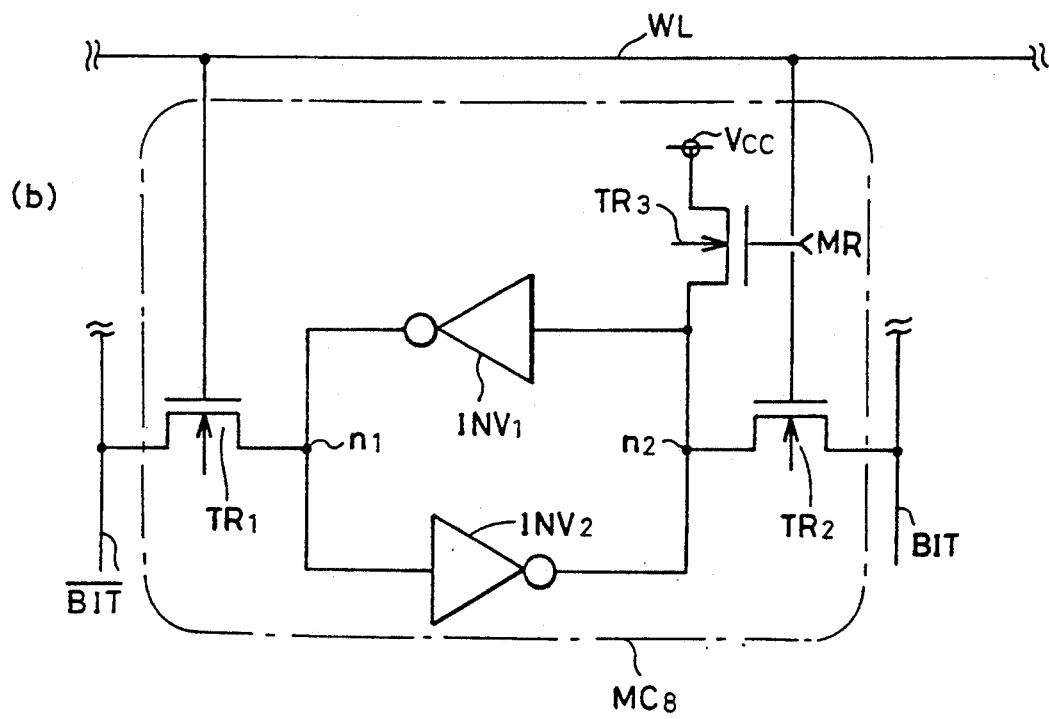
(b)

FIG. 4
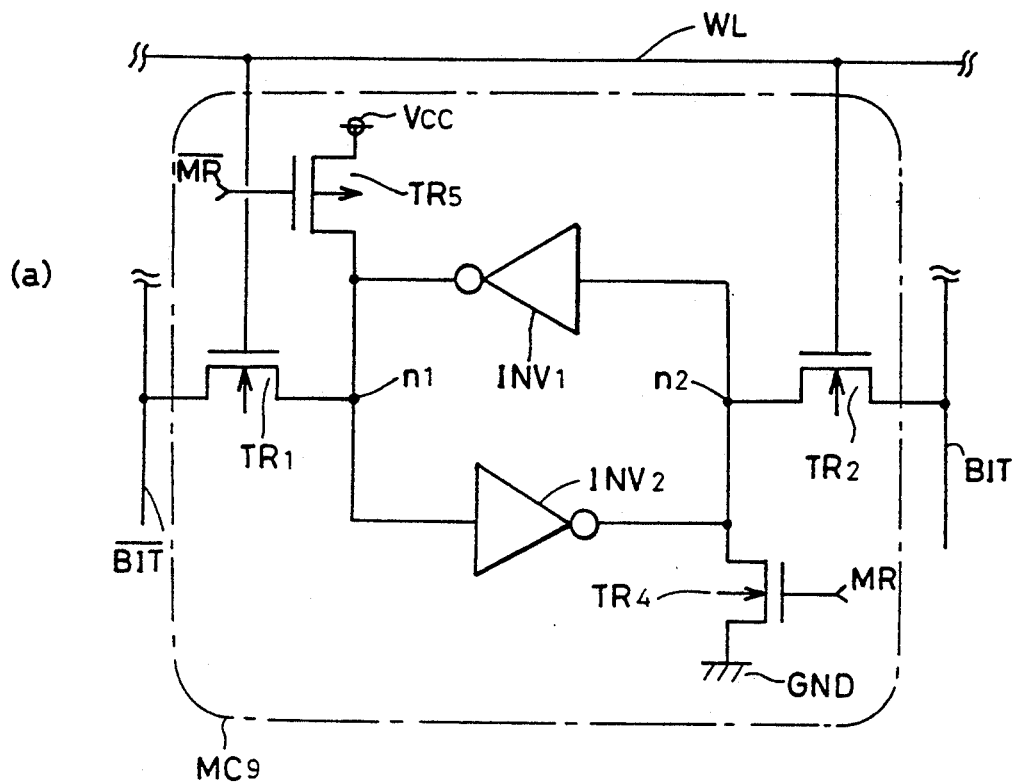
(a)
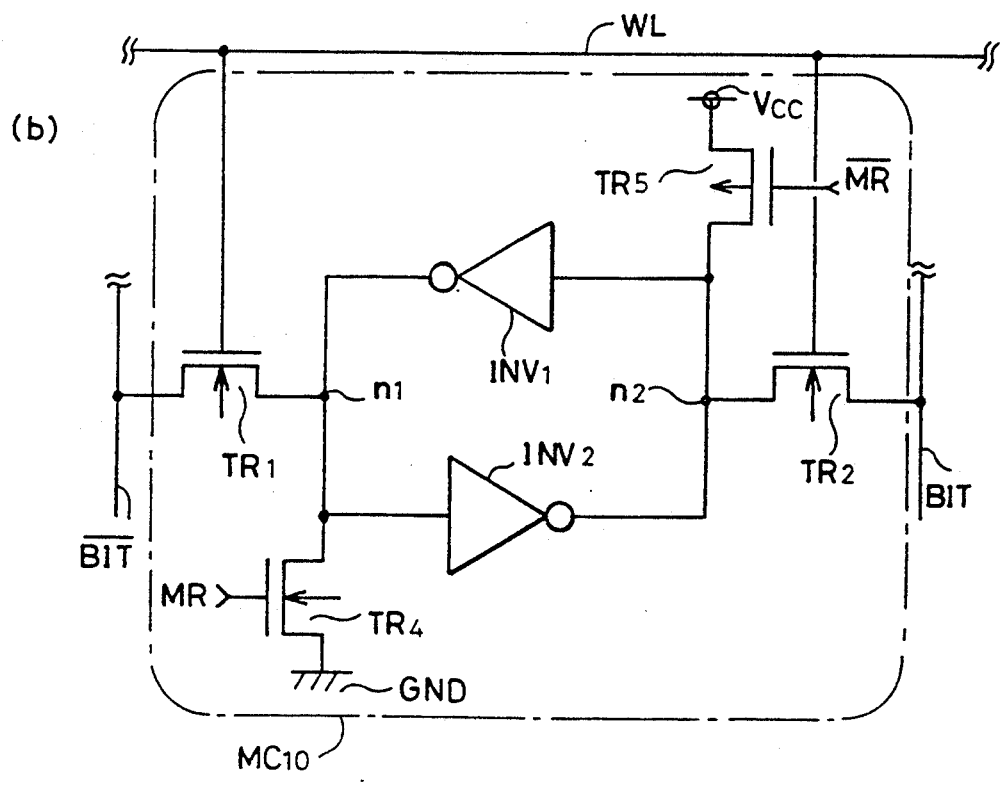
(b)

FIG. 5
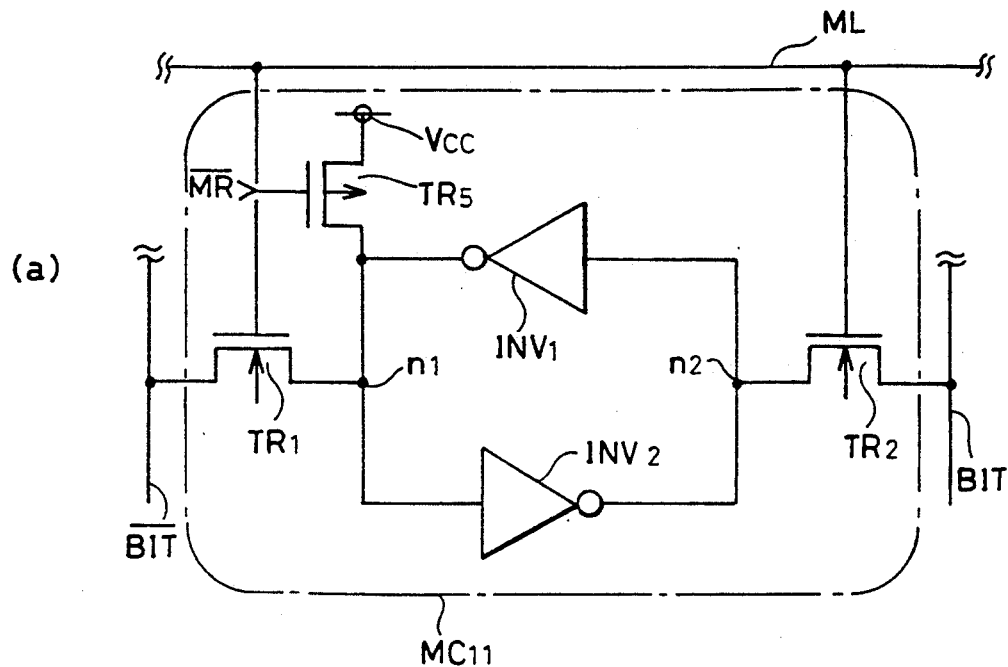
(a)
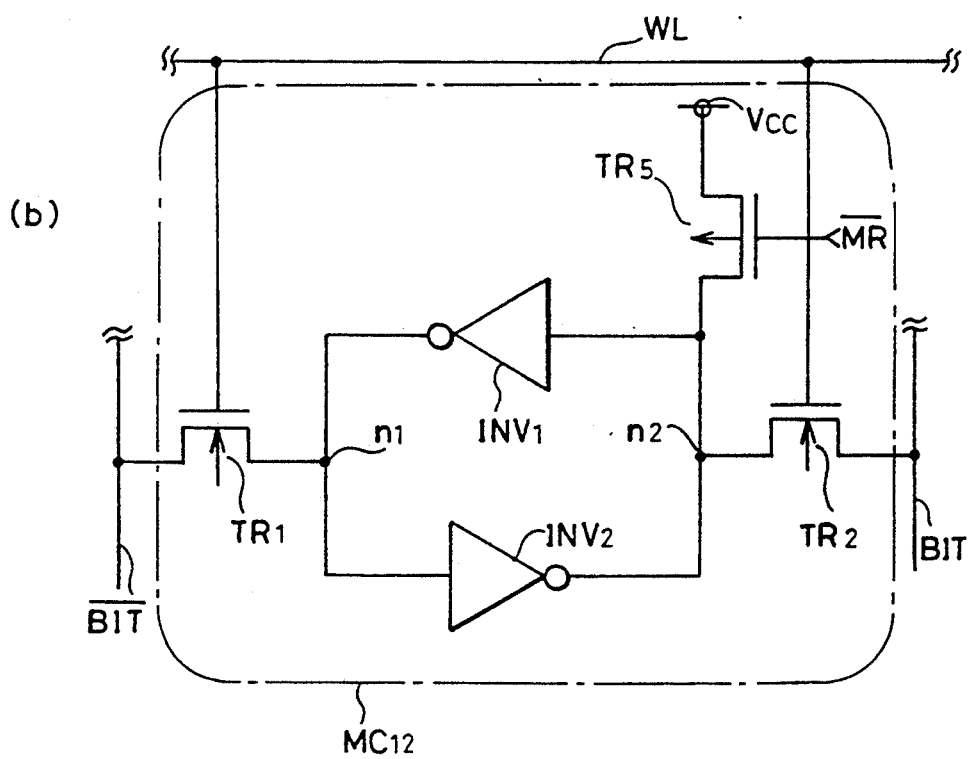
(b)

FIG.7
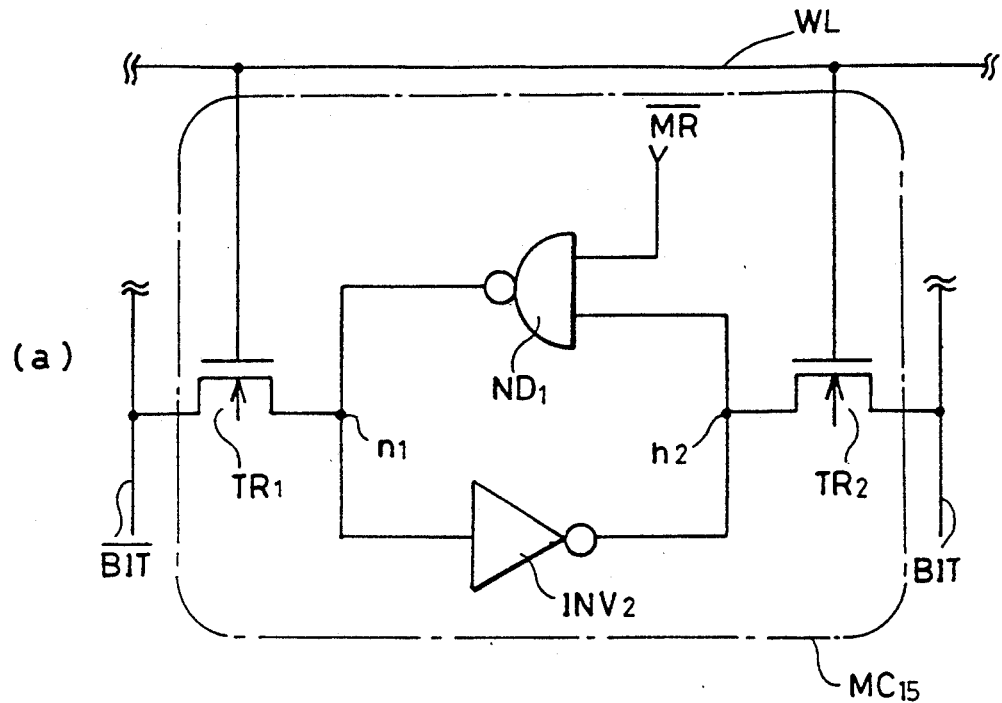
(a)
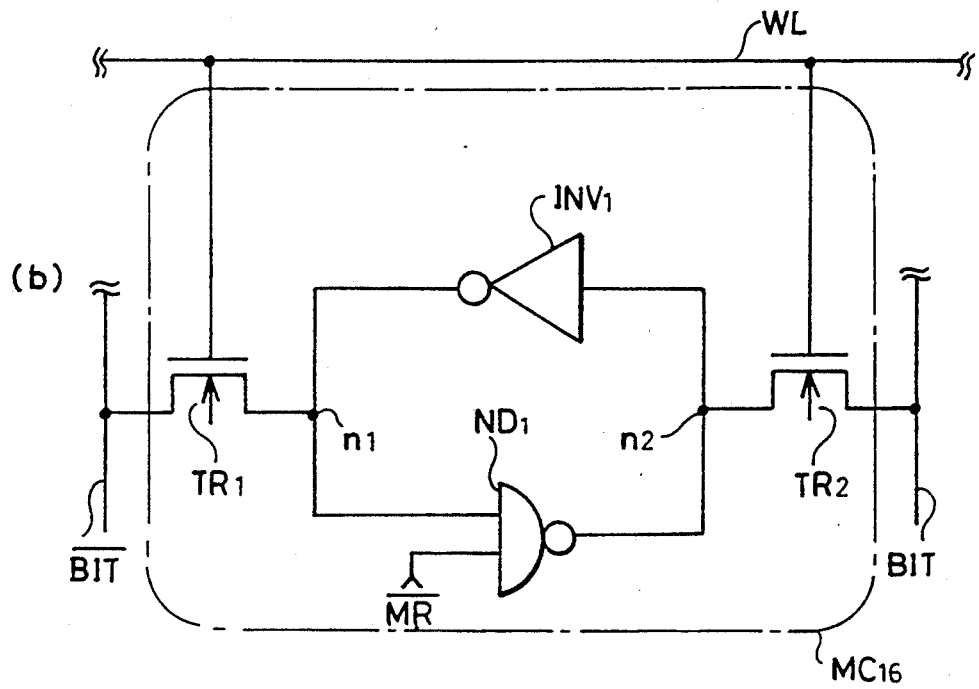
(b)

FIG. 8
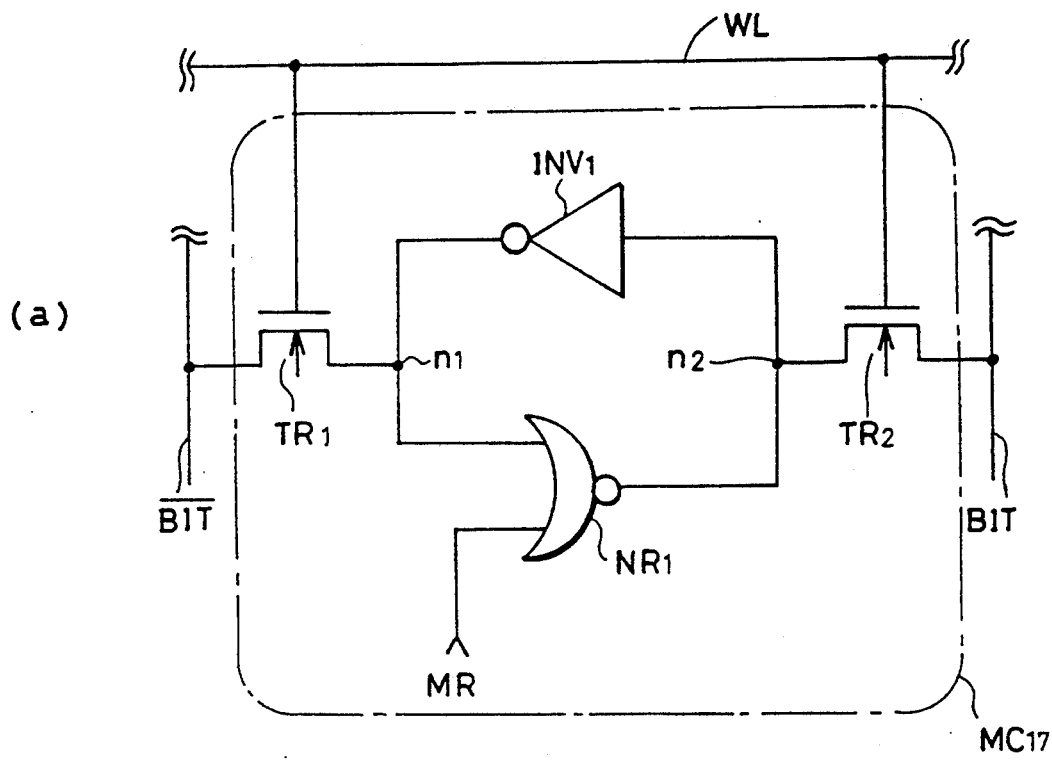
(a)
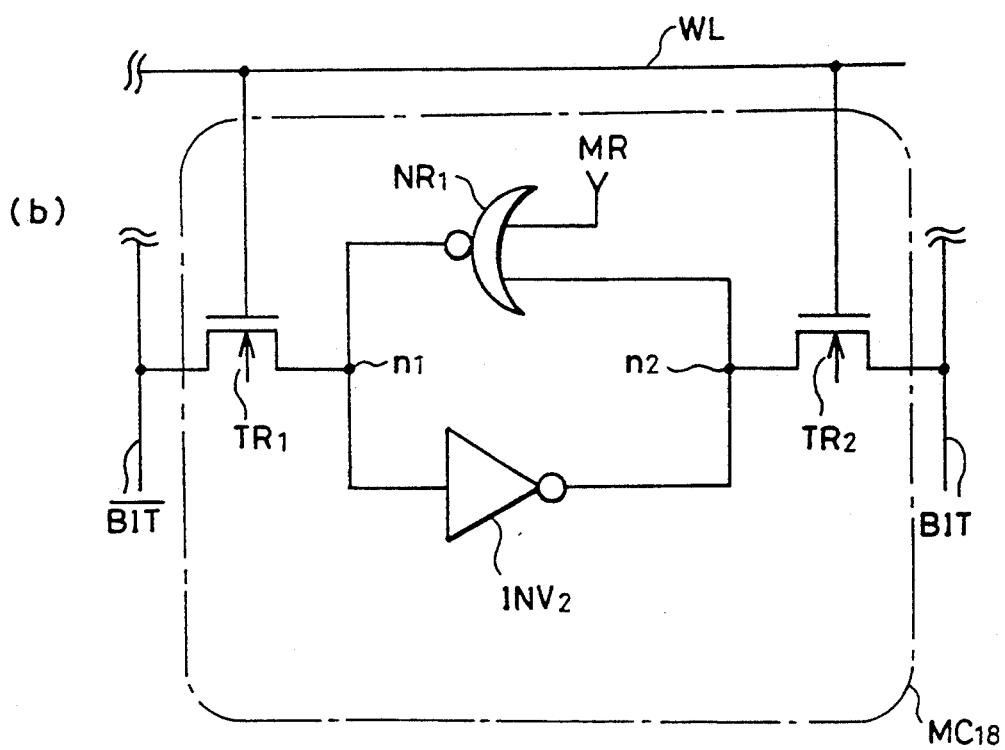
(b)

FIG.11
(a)
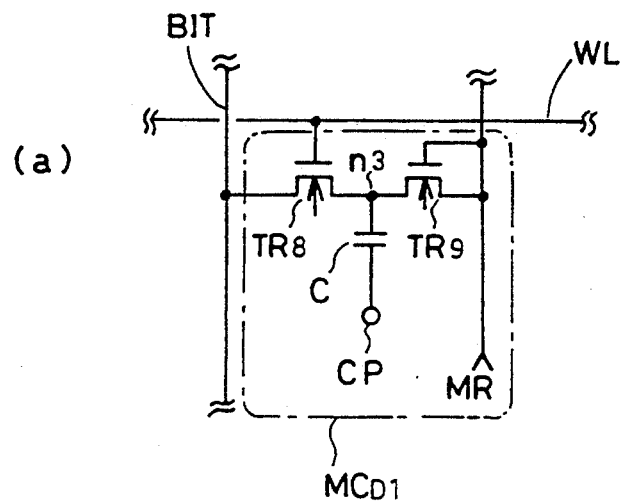
(b)
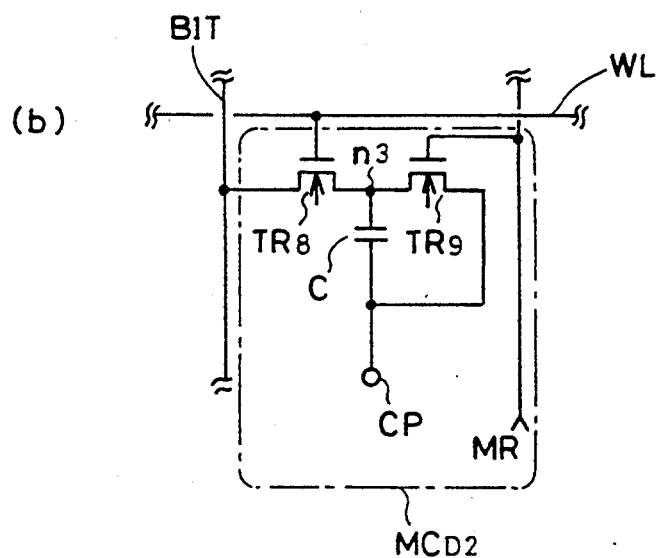

FIG.11
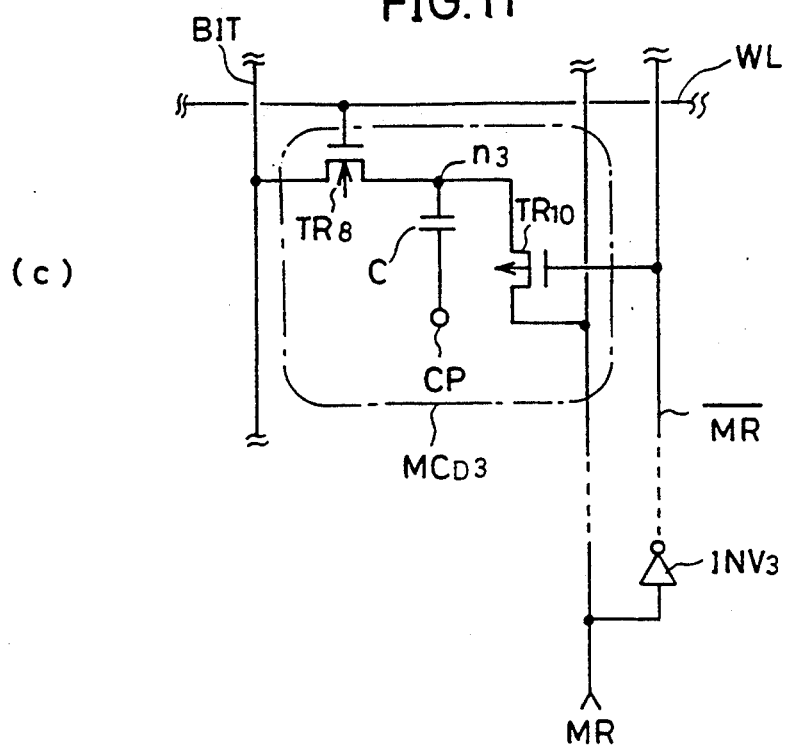
(c)
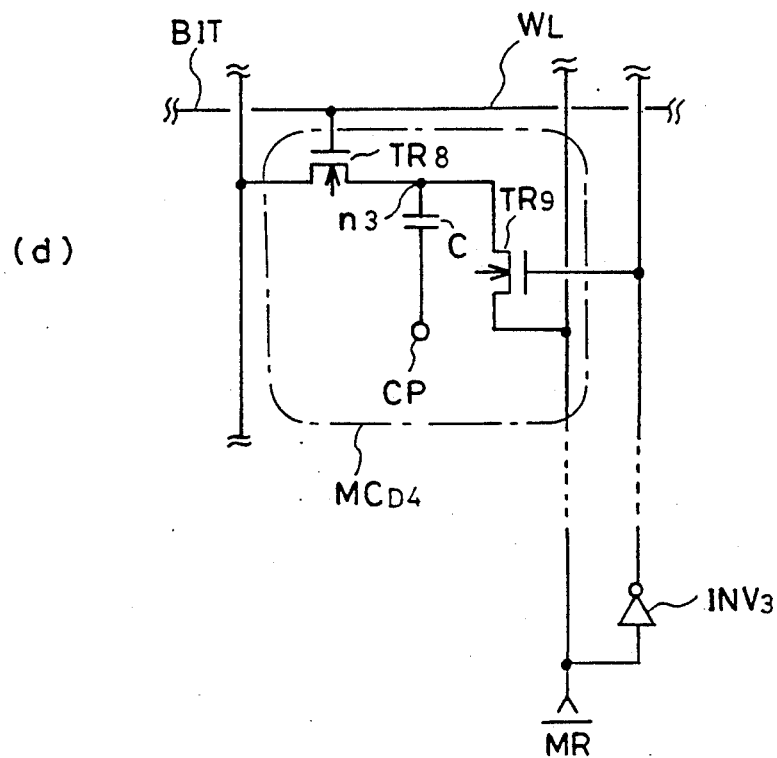
(d)

SEMICONDUCTOR MEMORY DEVICE CAPABLE OF INITIALIZING STORAGE DATA

BACKGROUND OF THE INVENTION

1. Field of the Invention

The present invention relates generally to semiconductor memory devices, and more particularly, to semiconductor memory devices having a function of initializing storage data of memory cells.

2. Description of the Background Art

At present, semiconductor memory devices such as RAMs (Random Access Memories) are incorporated into a single chip for use in various semiconductor integrated circuits or in various fields as units. Memory arrays of some of such semiconductor memory devices must be set to a predetermined storage data pattern (initialized) depending on their usages when a power is applied (at the start of the use) in an actual use. One example of such semiconductor memory devices is a cache memory or a matching memory. A cache memory is a memory operating at a very high speed for use in transferring and storing storage data of a main memory device. A matching memory includes memory storing identifiers which perform various data processing according to these identifiers in a computer system such as a data flow processor requiring the same. In a semiconductor memory device requiring such "initialization of data", the storage data of all the memory cells or part of the memory cells (for example in a case of a cache memory, memory cells of addresses storing identifiers) in a memory array is set to a logical value "1" or a logical value "0" in this initialization.

FIG. 14 is a schematic block diagram showing one example of an entire arrangement of a conventional SRAM (Static Random Access Memory) having a function of performing such initialization. Referring to FIG. 14, the SRAM includes a memory array 1b of a plurality of blocks each having memory cells for storing input data arranged in a matrix of rows and columns, a data input/output terminal $T_D$ for receiving input data and output data, a row address input terminal Ar for receiving an external row address signal which selects a row of a block in memory array 1b, a column address input terminal Ac for receiving an external column address signal which selects a column of a block in memory array 1b and a block address input terminal 1b for receiving an external block address selecting signal which selects a block in memory array 1b.

FIG. 15 is a circuit diagram showing an internal arrangement of memory array 1b. FIG. 9 shows a representation of memory cell columns in an arbitrary block.

Referring to FIG. 15, a memory cell MC is connected between two paired bit lines BIT and $\overline{\text{BIT}}$.

The memory cell MC includes two inverters INV1 and INV2 connected in anti-parallel, an N channel MOS transistor TR1 connected between the input end of inverter INV2 and the bit line $\overline{\text{BIT}}$ and an N channel MOS transistor TR2 connected between the input terminal of inverter INV1 and the other bit line BIT. Both of the gates of transistors TR1 and TR2 are connected to the same word line WL. The word line WL is connected to a row decoder 3 and the paired bit lines BIT and $\overline{\text{BIT}}$ are connected to a I/O circuit 6 in FIG. 14.

I/O circuit 6 forms a path for transferring the data read from memory array 1b to an output buffer 9 and a path for transferring the data to be written in memory array 1b from an input data control circuit 10 to memory array 1b. The former path includes a sense amplifier for amplifying data read from memory array 1b.

In data writing, row address buffer 2 accepts a row address signal applied to row address input terminal Ar. Then, row decoder 3 decodes the row address signal accepted by row address buffer 2 to selectively render data writable/readable in the memory cells in one row corresponding to the row address designated by the row address signal.

That is, row decoder 3 applies a "H" (logical high) level voltage to the word line WL (see FIG. 15) corresponding to the row of the memory cells designated by the row address signal. As a result, transistors TR1 and TR2 are turned on in all the memory cells connected to the word line WL for attaining the "H" level, and thereby electrically connecting all the memory cells to the corresponding bit line pairs of BIT and $\overline{\text{BIT}}$.

At the same time, a block address signal applied to block address input terminal 1b is accepted by a block address buffer 7. Then, a block decoder 8 decodes the block address signal accepted by block address buffer 7 to select all the bit line pairs corresponding to one block designated by the accepted block address signal in I/O circuit 6. That is, block decoder 8 selects one block from among the blocks in memory array 1a.

Similarly, a column address signal applied to column address input terminal Ac is accepted by a column address buffer 4. Then, a column decoder 5 decodes the column address signal accepted by column address buffer 4 to selectively enable only the data transmission to the memory cells of one column corresponding to the column address designated by the column address signal out of the memory cells in the block selected by block decoder 8. In other words, column decoder 5 electrically connects only the bit line pair corresponding to the column designated by the column address signal with input data control circuit 10 in I/O circuit 6 out of the bit line pairs of BIT and $\overline{\text{BIT}}$ in the selected block connected to I/O circuit 6. That is, column decoder 5 selects one pair from among the bit line pairs in memory array 1b.

Meanwhile, an input buffer 11 accepts each bit signal of the data applied to data input/output terminal $T_D$ and applies the same to input data control circuit 10 in the data writing. In ordinary data writing other than data writing for "initialization", input data control circuit 10 applies the data applied from input buffer 11 to I/O circuit 6. In I/O circuit 6, however, input data control circuit 10 is electrically connected to only the bit line pair corresponding to the memory cell column selected by column decoder 5 as described above. Then, I/O circuit 6 applies the data supplied from input data control circuit 10 as signals of complementary level voltages to the bit line pair of BIT and $\overline{\text{BIT}}$ of FIG. 15, respectively. More specifically, all the transistors TR1 and TR2 are turned on in memory array 1b, and each of the transistors has a gate connected to one word line (selected word line) WL supplied with a "H" level potential by row decoder 3.

In addition, I/O circuit 6 applies a potential of a logical value corresponding to the data applied from input data control circuit 10 and an inversion potential thereof to two bit lines BIT and $\overline{\text{BIT}}$ constituting the bit line pair selected by column decoder 5, respectively. As a result, the potential applied to the corresponding bit line BIT is supplied to inverter INV1 through transistor TR2 in the memory cell arranged at the cross-over point between the column selected by column decoder 5 and the row selected by row decoder 3, with reference to FIG. 15. Inverter INV1 inverts that potential and outputs the inverted potential to inverter INV2. Inverter INV2 is supplied with a potential of an opposite level to the input potential of inverter INV from the other bit line BIT through transistor TR1. In this memory cell, therefore, the nodes between inverters INV1 and INV2 are fixed to the potential applied to bit line $\overline{BIT}$ and corresponding to the inverse logical value to the input data and the potential applied to bit line BIT and corresponding to the input data. That is, the input data is written in this memory cell.

Thereafter, row decoder 3 lowers the potential on the word line WL corresponding to this memory cell to a "L" level. As a result, the transistors TR1 and TR2 are turned off in all the memory cells connected to the selected word line WL including this memory cell. However, the respective outputs of inverters INV1 and INV2 are fed back to their inputs, so that the potentials at the nodes between inverters INV1 and INV2 are maintained at the level in the data writing. That is, the written data is stored in this memory cell. A node to be maintained at a potential corresponding to data such as the node between inverters INV1 and INV2 is referred to as storage data hereinafter.

The data input from data input/output terminal $T_D$ is written and stored in this way in the memory cell arranged at the cross-over point between the column designated by the column address signal and the row designated by the row address signal in the block designated by the block address signal out of the blocks in memory array 1b.

FIG. 16 is a circuit diagram showing in more detail the respective arrangements of a memory cell included in memory array 1b shown in FIG. 14. Referring to FIG. 16, each memory cell MC in memory array 1b includes the above-described transistors TR1 and TR2, two P channel MOS transistors 210 and 220 and two N channel MOS transistors 230 and 240. Transistors 210 and 230 are connected in series between a power supply Vcc and ground GND to constitute inverter INV1. A node n1 between transistors 210 and 230 is the output end of this inverter INV1. Transistors 220 and 240 are also connected in series between power supply Vcc and ground GND to constitute inverter INV2. A node n2 between transistors 220 and 240 is the output end of this inverter INV2. The gate of transistor 210 and the gate of transistor 230 are connected to each other. The gate connection point between transistors 210 and 230 is connected to an output end n2 of inverter INV2 as the input end of inverter INV1. The gate of transistor 220 and the gate of transistor 240 are also connected to each other. The gate connection point between transistors 220 and 240 is connected to output end n1 of inverter INV1 as the input end of inverter INV2.

In data reading, row address buffer 2 and row decoder 3, column address buffer 4 and column decoder 5, and block address buffer 7 and block decoder 8 operate similarly to those in the data writing, for thereby rendering data writable/readable only the memory cell selected by the block address signal, the column address signal and row address signal out of the memory cells in memory array 1b.

In other words, referring to FIG. 15, the transistors TR1 and TR2 are turned on and the corresponding bit line pair of BIT and $\overline{BIT}$ is electrically connected to output buffer 9 through I/O circuit 6, in one memory cell corresponding to the word line WL supplied with a "H" level potential by row decoder 3 and corresponding to the bit line pair selected by column decoder 5 in the block selected by block decoder 8. Upon the turning-on of transistors TR1 and TR2, the potentials on the corresponding bit line pair of BIT and $\overline{BIT}$ change in response to the potentials at the connection points, that is, the storage nodes, between inverters INV1 and INV2. In other words, the storage data of the selected memory cell is read onto the corresponding bit line pair. The potential change of this bit line pair of BIT and $\overline{BIT}$ is sensed/amplified by a sense amplifier in I/O circuit 6, and converted to the potential corresponding to the storage data and then applied to output buffer 9. Output buffer 9 outputs the potential corresponding to this storage data as the read data to data input/output terminal $T_D$.

In actuality, a chip and input/output control circuit 13 controls an operation timing of row address buffer 2, column address buffer 4, block address buffer 7, output buffer 9 and input buffer 11 such that the SRAM operates in data writing and reading in such a manner as described above.

This control circuit 13 carries out this controlling based on a chip enable signal externally applied to a chip enable terminal $\overline{CE}$, a write enable signal externally applied to a write enable terminal $\overline{WE}$ and an output enable signal externally applied to an output enable terminal $\overline{OE}$. The chip enable signals is for selecting a chip to be operated at present in the device containing this SRAM chip and the signal attains a "L" level when this SRAM chip should be operated. A write enable signal is for indicating whether this memory cell should be set at a data writing mode at present or not and attains a "L" level when this SRAM is set at the data writing mode. An output enable signal is for indicating whether or not the read data should be output from this SRAM at present and the signal attains a "L" level when the read data should be output.

Control circuit 13 activates the operations of row address buffer 2, column address buffer 4 and block address buffer 7 in a period when this SRAM chip should be operated, and the period when a chip enable signal is at a "L" level. Control circuit 13 activates input buffer 11 in a period in which data should be written in this memory, and the period when a write enable signal is at a "L" level, such that the data applied to input/output terminal $T_D$ is taken into the SRAM. Control circuit 13 activates output buffer 9 such that the read data from memory array 1b is externally output in a period when the read data should be output, and the period when an output enable signal is at a "L" level.

The foregoing operation of this SRAM is the same as that of an ordinary SRAM without an initialization function.

This SRAM shown in FIG. 14, however, includes an initialization data control circuit 12, a clock generation circuit 14 and an initialization address generating circuit 15 in addition to the function part provided in such an ordinary SRAM as described above.

Initialization address generating circuit 15 generates a block address signal, a row address signal and a column address signal indicative of a block address, a row address and a column address, respectively, corresponding to the address of a predetermined memory cell to be initialized and applies the same to block decoder 8, column decoder 5 and row decoder 3, respectively.

Initialization data control circuit 12 generates predetermined data (initialization data) to be applied to the memory cell to be initialized at initialization and applies the same to input data control circuit 10.

Clock generation circuit 14 generates clock signals for controlling initialization address generation circuit to generate a block address signal, a row address signal and a column address signal and for controlling initialization data control circuit 12, to generate initialization data, based on control signals (initialization signals) for initialization externally applied to an initialization signal input terminal $T_1$.

An initialization signal is applied to initialization signal input terminal $T_1$ at the application of power. Clock generation circuit 14 generates the above-described clock signal in response to this initialization signal. Then, initialization data control circuit 12 and initialization address generation circuit 15 operate as described above in response to this clock signal. In such initialization, input buffer 11 which accepts external input data, is still disabled by control circuit 13, whereby input data control circuit 10 receives none of ordinary data to be written as an input but applies the data supplied from initialization data control circuit 12 as data to be written to I/O circuit 6. Similarly, at this time, row address buffer 2, column address buffer 4 and block address buffer 7 are still disabled by column circuit 13 at this time, whereby row decoder 3, column decoder 5 and block decoder 8 receive none of the external input address signals. At the initialization, therefore, row decoder 3, column decoder 5 and block decoder 8 receive only the row address signal, column address signal and block address signal applied from initialization address generation circuit 15, respectively, and decode the same. In this case therefore, memory cells to be initialized are sequentially selected on an address basis in memory array 1b, so that the initialization data generated by generation data control circuit 12 is written thereto.

Initialization data control circuit 12 and initialization address generation circuit 15 may directly receive necessary clocks as inputs.

As described in the foregoing, in this semiconductor memory device the storage data of a predetermined memory cell is initialized by a circuit for initialization additionally provided in the device, that is, by means of the hardware, at the power on. The circuit for initialization, that is, initialization data control circuit 12, clock generation circuit 14 and initialization address generation circuit 15 is incorporated in this semiconductor memory device beforehand. Thus, the address signal generated from the initialization is uniform, making it impossible to initialize memory cells of different addresses at each initialization and to initialize the data of memory cells to different data at each initialization. Therefore, initialization is not performed by means of hardware but initialization is generally carried out by software for such irregular initialization as this.

Initialization by software performs initialization by using software such as a program in the system including a semiconductor memory device for example. More specifically, the system, supplied with a program for initialization to generate addresses and data, generates by itself the addresses to be initialized and initialization data outside the semiconductor memory device and applies the same to the semiconductor memory device by executing the program. Then, the semiconductor memory device operates similarly to that in ordinary data writing to write the generated data in the generated addresses. Such initialization requires none of such circuits for initialization in the semiconductor memory device as described previously. That is, the semiconductor memory device performs an operation of writing given data in given addresses both in data writing for initialization and in ordinary data writing. In this case, of course a mode setting instruction for setting the semiconductor memory device to operate in a writing mode, when write addresses and write data to be applied to the semiconductor memory device for initialization should be written in the program or the like.

In the initialization by hardware, when the data bit to be initialized is fixed irrespective of address and the addresses of the memory cell which storage data should be initialized are regular such as all the addresses, all the even-numbered addresses, all the odd-numbered addresses and the serial addresses from address 0 to a predetermined address in the memory array and the initialization data to be written is also regular data that it is the same for each address, initialization data control circuit 12, clock generation circuit 14 and initialization address generation circuit 15 of FIG. 14 can be achieved by circuits of relatively simple structure. However, if the data bit to be initialized, the address to be initialized and the initialization data to be written and the like are irregular, these circuits for initialization are made complicated. For example, initialization address generation circuit 15 is a circuit for generating an address signal by counting clocks from clock generation circuit 14 which includes a counter for carrying out this counting. If the address to be generated is irregular, complicated control is required of the counting operation of this counter. Thus, a complicated address to be initialized results in a complicated arrangement of initialization address generation circuit 15. As a result, execution of the complication initialization requires an increased circuit for initialization in scale, for thereby making it impossible to provide these circuits in the semiconductor memory device. In such a case, these circuit portions should be structured separately from the semiconductor memory device. For this reason, complicated initialization is generally performed by software as described above.

As shown in the foregoing, initialization of storage data of a semiconductor memory device conventionally includes that by means of hardware and that by software.

In the former case, a time period required for initialization depends on a time required for the circuits for initialization (initialization data control circuit 12, clock generation circuit 14 and initialization address generation circuit 15 of FIG. 14) provided in the semiconductor memory device to generate addresses and data and to write all the generated data in all the generated addresses. In the latter case, a time period required for initialization depends on a time period required for the system containing the semiconductor memory device to carry out the program for initialization. However, writing of the initialization data is carried out by an ordinary writing operation of the semiconductor memory device in both cases.

In such a semiconductor memory device as a SRAM, addresses in which data is written are sequentially selected one by one and the corresponding data is written in one of these selected addresses in a data writing as described above. Therefore, data cannot be written simultaneously in a plurality of addresses. The time required for writing the initial data is accordingly increased as the number of memory cells to be initialized is increased, that is, the number of addresses and data bits to be initialized is increased, which results in the increased time period required for initialization. In recent years semiconductor memory devices have been made large in scale, which is followed by the increased number of memory cells to be initialized. As a result, such a conventional initialization method makes an initialization time period longer and consequently decreases an operational speed of a semiconductor device, which results in a reduced operational speed of a system containing the device.

In initializing storage data of a semiconductor memory device by means of hardware as described above, the execution of complicated initialization requires large additional circuits. Such additional circuits require more power to be consumed and an increase in a chip area results, which are not preferable in view of low power consumption and miniaturization of a semiconductor integrated circuit device. Such complicated initialization by means of software also makes the program complicated to increase an execution time due to the increased program size, which results in an increase in initialization time.

SUMMARY OF THE INVENTION

An object of the present invention is to provide a semiconductor memory device in which storage data of a memory array can be initialized in a short time period.

Another object of the present invention is to provide a semiconductor memory device in which storage data of a memory array can be initialized to a complicated pattern without making additional circuits large in scale.

A further object of the present invention is to provide a semiconductor memory device in which storage data of a memory array can be initialized to a complicated pattern without increasing power consumption.

A still further object of the present invention is to provide a semiconductor memory device which does not require a program of large size for initializing storage data of a memory array.

A still further object of the present invention is to provide a semiconductor memory device in which storage data of a plurality of memory cells can be initialized at the same time.

A still further object of the present invention is to provide a semiconductor memory device in which a predetermined memory cell can be accurately initialized to predetermined data at a high speed without significantly making additional circuits large in scale for initialization even if addresses to be initialized, initialization data and the like are irregular.

A still further object of the present invention is to provide a semiconductor memory device by which an operational speed of a system containing the same can be increased.

In order to obtain the above-described objects, the semiconductor memory device according to the present invention includes a plurality of memory cells containing predetermined memory cells which storage data should be initialized and each having a storage node to be maintained at a potential corresponding to the storage data, potential forcing circuits each provided in each of the predetermined memory cell to a potential corresponding to predetermined initialization data and a circuit for activating all the potential forcing circuits in response to application of power.

In the semiconductor memory device arranged as described above according to the present invention, when power is applied to this semiconductor memory device, the respective storage nodes of the predetermined memory cells are simultaneously forced to the potentials corresponding to initialization data by the corresponding potential forcing circuits. That is, the storage data of the predetermined memory cells are simultaneously initialized in response to the application of power.

In the semiconductor memory device arranged as described above according to the present invention, when power is applied to this semiconductor memory device, the respective storage nodes of the predetermined memory cells are simultaneously forced to the potentials corresponding to initialization data by the corresponding potential forcing circuits. That is, the storage data of the predetermined memory cells are simultaneously initialized in response to the application of power.

According to a preferred embodiment, the present invention is applicable to a semiconductor memory device including a plurality of memory cells each having first and second storage nodes and first and second inverters; the plurality of memory cells being arranged in a matrix of a plurality of rows and a plurality of columns, word lines each provided corresponding to each of the plurality of rows and bit line pairs and each pair is provided corresponding to each of the plurality of columns. Each bit line pair includes a first bit line connected in common to the respective first storage nodes of the memory cells arranged in the corresponding column and a second bit line connected in common to the respective second storage nodes of the memory cells arranged in the corresponding column. Each memory cell is provided with a MOS transistor having a gate connected to the word line corresponding to the row in which the memory cell is arranged between the first bit line corresponding to the column in which the memory cell is arranged and the first storage node, and a MOS transistor having a gate connected to that corresponding word line between the second bit line corresponding to the column in which the memory cell is arranged and the second storage node. These MOS transistors conduct in ordinary data writing to apply the potential on the first bit line and the potential on the second bit line to the first storage node and the second storage node, respectively. In each memory cell, a first inverter and a second inverter are connected in anti-parallel between the first storage node and the second storage node to constitute a latch circuit.

Each potential forcing circuit preferably includes at least either a first MOS transistor provided between a first storage node of a corresponding memory cell and a first power supply for supplying a first potential or a second MOS transistor provided between a second storage node of the corresponding memory cell is provided and a second power supply for supplying a second potential complementary to the first potential. If the potential forcing circuit includes only one of the first and second MOS transistors, the activation circuit includes a first control signal generation circuit for generating a first control signal which controls the first MOS transistor such that the first MOS transistor is turned on for a predetermined time period in response to the application of a drive voltage for driving the semiconductor memory device to the same. If the potential forcing circuit includes only one of the first and second MOS transistors, the activation circuit includes a first control signal generation circuit for generating a first control signal which controls the first MOS transistor such that the first MOS transistor is turned on for a predetermined time period in response to the application of a drive voltage for driving the semiconductor memory device to the same. If the potential forcing circuit includes both first and second MOS transistors, the activation circuit includes first and second control signal generation circuits for generating first and second control signals which control the first and the second MOS transistors, respectively, such that both of the first and the second MOS transistors are turned on for a predetermined time period in response to the application of a drive voltage to the semiconductor memory device. When the polarity of the first MOS transistor and that of the second MOS transistor are opposite to each other, the potentials of the first control signal and the second control signal should be complementary to each other. If polarity of the first MOS transistor and that of the second MOS transistor are the same, the first control signal and the second control signal can have the same potential, so that one control signal generation circuit is necessary.

If a potential of a first control signal and a potential of a second control signal are equal to the first potential and the second potential, respectively, in the above-described predetermined time period, the first control signal generation circuit and the second control signal generation circuit can be used as the first power supply and the second power supply, respectively.

In each predetermined memory cell for which storage data is to be initialized, either a first inverter or a second inverter is preferably replaced by a two-input logic gate provided between a first storage node and a second storage node for supplying a signal of a potential corresponding to initialization data to the second storage node (or the first storage node) irrespective of the potential at the first storage node (or the second storage node). In such a case, the activation circuit includes a control signal generation circuit for generating a signal which controls the logic gate in response to the application of a drive voltage to the semiconductor memory device such that the supplying function of the logic gate is activated for a fixed time period. In each of the predetermined memory cells, used as the logic gate is for example, a two-input NAND gate or a two-input NOR gate each having first and second input ends for receiving a potential at the first storage node (or the second storage node) and the control signal, respectively, and an output end connected to the second storage node (or the first storage node). When the two-input NAND gate is used as a logic gate, the logical level of the potential of the control signal in the fixed time period is set to low. When the two-input NOR gate is used as a logic gate, the logical level of the potential of the control signal in the fixed time period is set to high.

The activation circuit may include first and second control signal generation circuits for generating first and second control signals of complementary potentials for controlling a logic gate, respectively, such that the supplying function of the logic gate is activated in a fixed time period in response to the application of a drive voltage to the semiconductor memory device. With the activation circuit arranged as described in the foregoing, the logic gate can be constituted by only three MOS transistors. In other words, in each of the predetermined memory cells, the logic gate includes a first MOS transistor having a gate connected to a first storage node and provided between a second storage node and a first power supply for supplying a first potential, a second MOS transistor having a gate for receiving an output of the first control signal generation circuit and provided between the second storage node and the first power supply, and a third MOS transistor having a gate connected to the first storage node and provided between the second storage node and provided between the second storage node and the second control signal generation circuit. The polarity of the first MOS transistor and that of the second MOS transistor are the same and that of the third MOS transistor is opposite to those of the first and the second MOS transistors. If the polarity of the first and the second MOS transistors is of N type, a logical level of a first potential is low and a logical level of a first control signal potential is high in the fixed time period, the first, the second and the third MOS transistors constitute a two-input NOR gate. If the polarity of the first and the second MOS transistor is of P type, the logical level of the first potential is high and the logical level of the first control signal is low in the fixed time period, the first, the second and the third MOS transistors constitute a two-input NAND gate.

According to another preferred embodiment, the present invention is applicable to a semiconductor memory device including a plurality of memory cells each having a single storage node and a capacitive coupling element, the plurality of memory cells being arranged in a matrix of a plurality of rows and columns; word lines each provided corresponding to each of the plurality of rows and bit lines and each is provided to correspond with each of the plurality of columns. In each of the plurality of memory cells, a bit line corresponding to the column in which the memory cell is arranged is connected to a storage node through a first MOS transistor controlled by a potential on a word line corresponding to the row in which the memory cell is arranged. Since a capacitive coupling element is provided between a storage node and a low potential source in each memory cell, the capacitive coupling element is charged or discharged when a first MOS transistor is turned on in response to the potential on the corresponding bit line.

Each potential forcing circuit preferably includes a second MOS transistor provided separately from the first MOS transistor, for charging or discharging a capacitive coupling device of the memory cell in which the circuit is provided irrespective of the potential on the bit line corresponding to the column in which the memory cell is arranged. The activation circuit for example includes only a first control signal generation circuit for generating a first control signal which controls a second MOS transistor such that the second MOS transistor is turned on for a fixed time period in response to the application of a drive voltage to a semiconductor memory device for driving the same, or both of the first control signal generation circuit and a second control signal generation circuit for generating a second control signal having a potential complementary to a first control signal. When the activation circuit includes only the first control signal generation circuit, the second MOS transistor is provided between a storage node and a low potential source, between a storage node and a first control signal generation circuit and the like in each of the predetermined memory cells which storage data should be initialized. When the activation circuit includes the first and the second control signal generation circuits, the second MOS transistor is provided between a storage node and a second control signal generation circuit in each of the predetermined memory cells.

The present invention therefore allows initialization of storage data of predetermined memory cells to predetermined initialization data at a speed higher than in a conventional one by adding a simple circuit for initialization to a memory cell, by which a semiconductor memory device capable of performing complicated initialization with high reliability at a high speed can be provided. As a result, such a semiconductor memory device used in various semiconductor integrated circuit devices and systems leads to an improvement of functions of the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2a and b are partial circuit diagrams of a memory array in a SRAM according to one embodiment of the present invention.

FIGS. 3a and b are circuit diagrams showing an arrangement of a memory cell according to a further embodiment of the present invention.

FIGS. 4a and b are circuit diagrams showing an arrangement of a memory cell according to a still further embodiment of the present invention.

FIGS. 5a and b are circuit diagrams showing an arrangement of a memory cell according to a still further embodiment of the present invention.

FIGS. 7a and b are circuit diagrams showing an arrangement of a memory cell according to a still further embodiment of the present invention.

FIGS. 8a and b are circuit diagram showing an arrangement of a memory cell according to a still further embodiment of the present invention.

FIGS. 10 and 11a-11d are circuit diagrams showing an arrangement of a memory cell in a DRAM according to a still further embodiment of the present invention.

DESCRIPTION OF THE PREFERRED EMBODIMENTS

Figure 1:
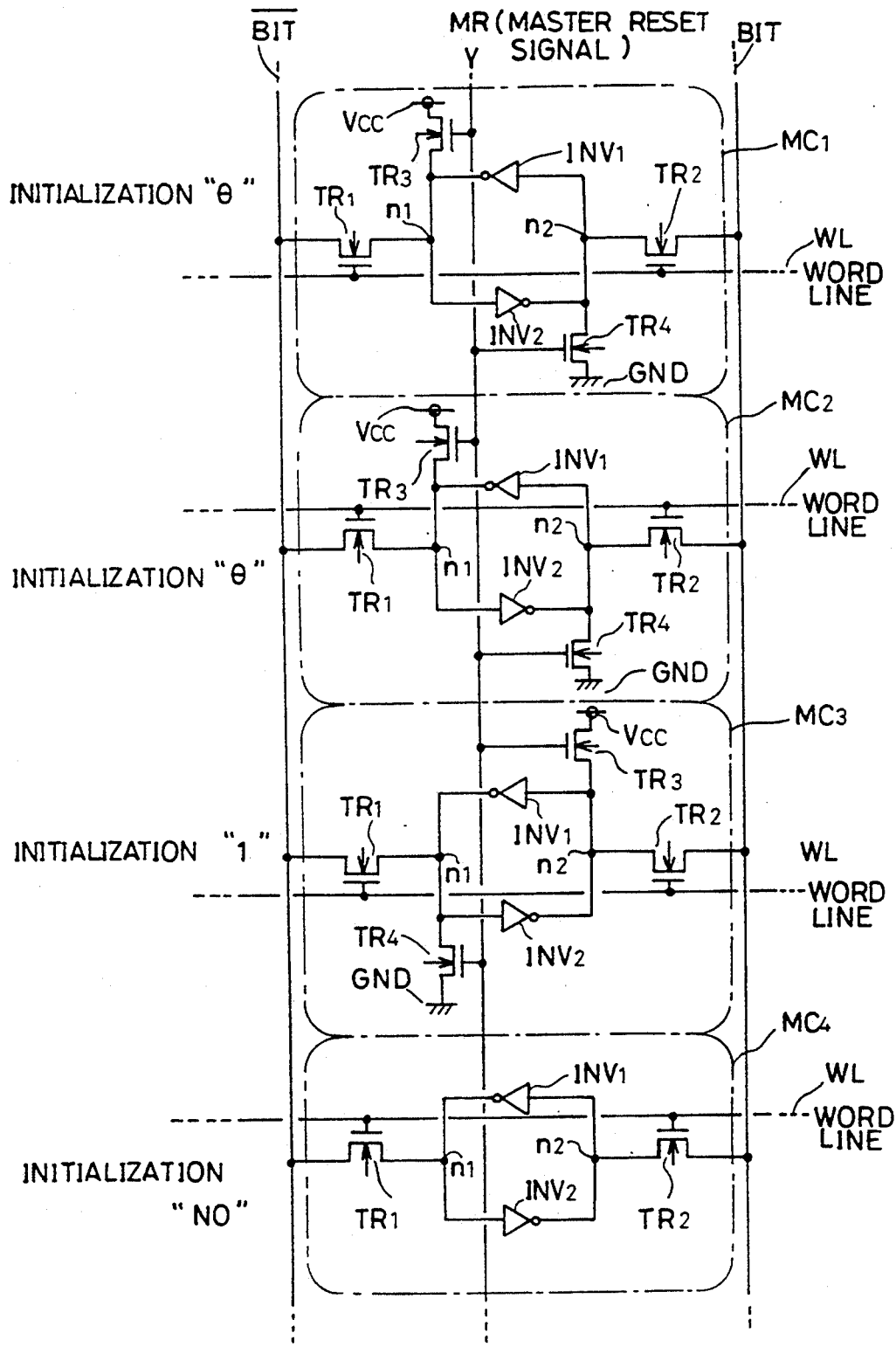
FIG. 1 is partial circuit diagram of a memory array in a SRAM according to one embodiment of the present invention.
Figure 12:
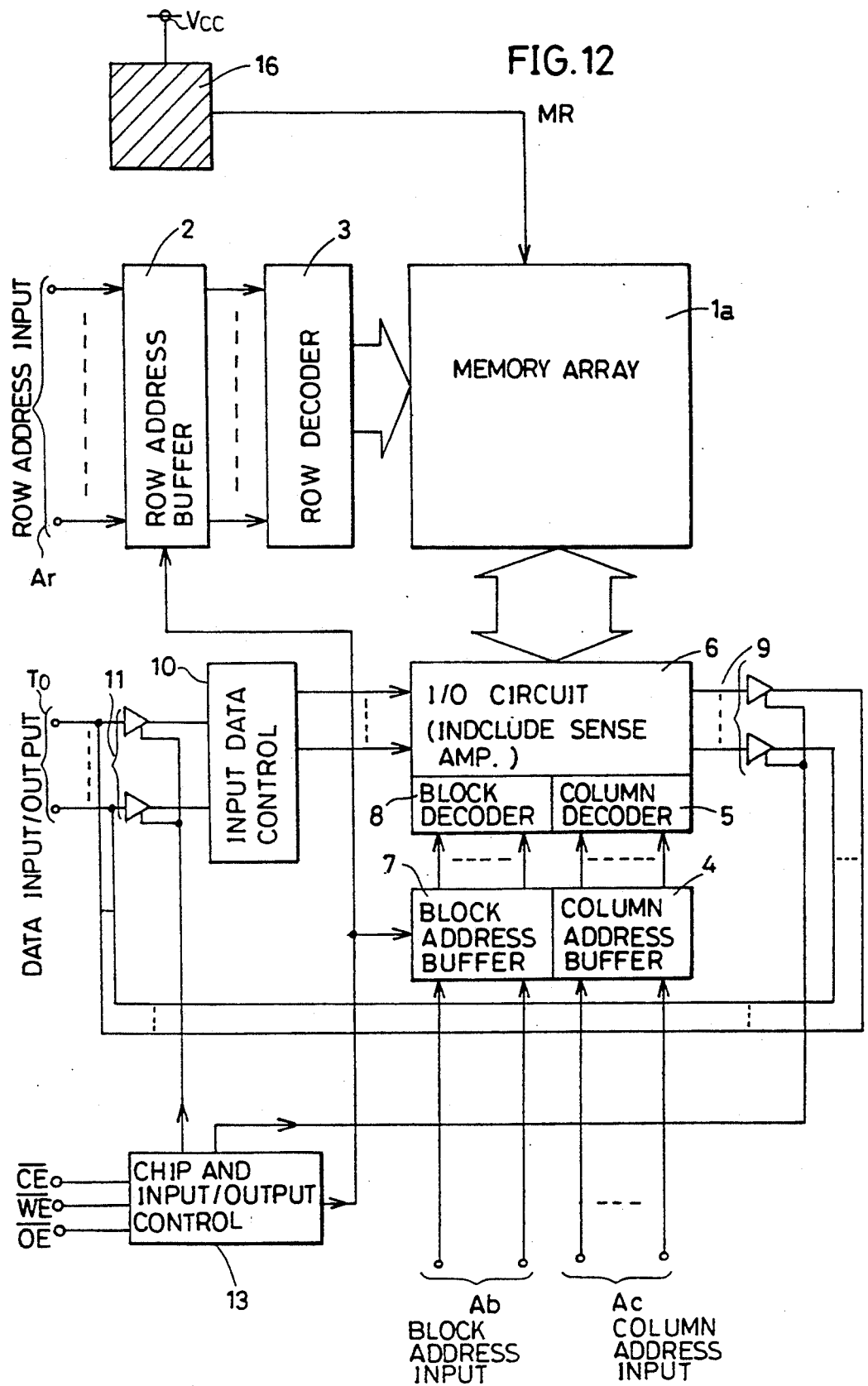
FIG. 12 is a schematic block diagram showing an entire arrangement of a SRAM according to an embodiment of the present invention.

FIG. 1 is the partial circuit diagram of a memory array in a SRAM according to one embodiment of the present invention and FIG. 12 is the schematic block diagram showing the entire arrangement of the SRAM according to the present embodiment. It is assume that memory cells to be initialized and initialization data to be written in those at the initialization do not vary with each initialization but are fixed to predetermined ones in this SRAM.

Figure 14:
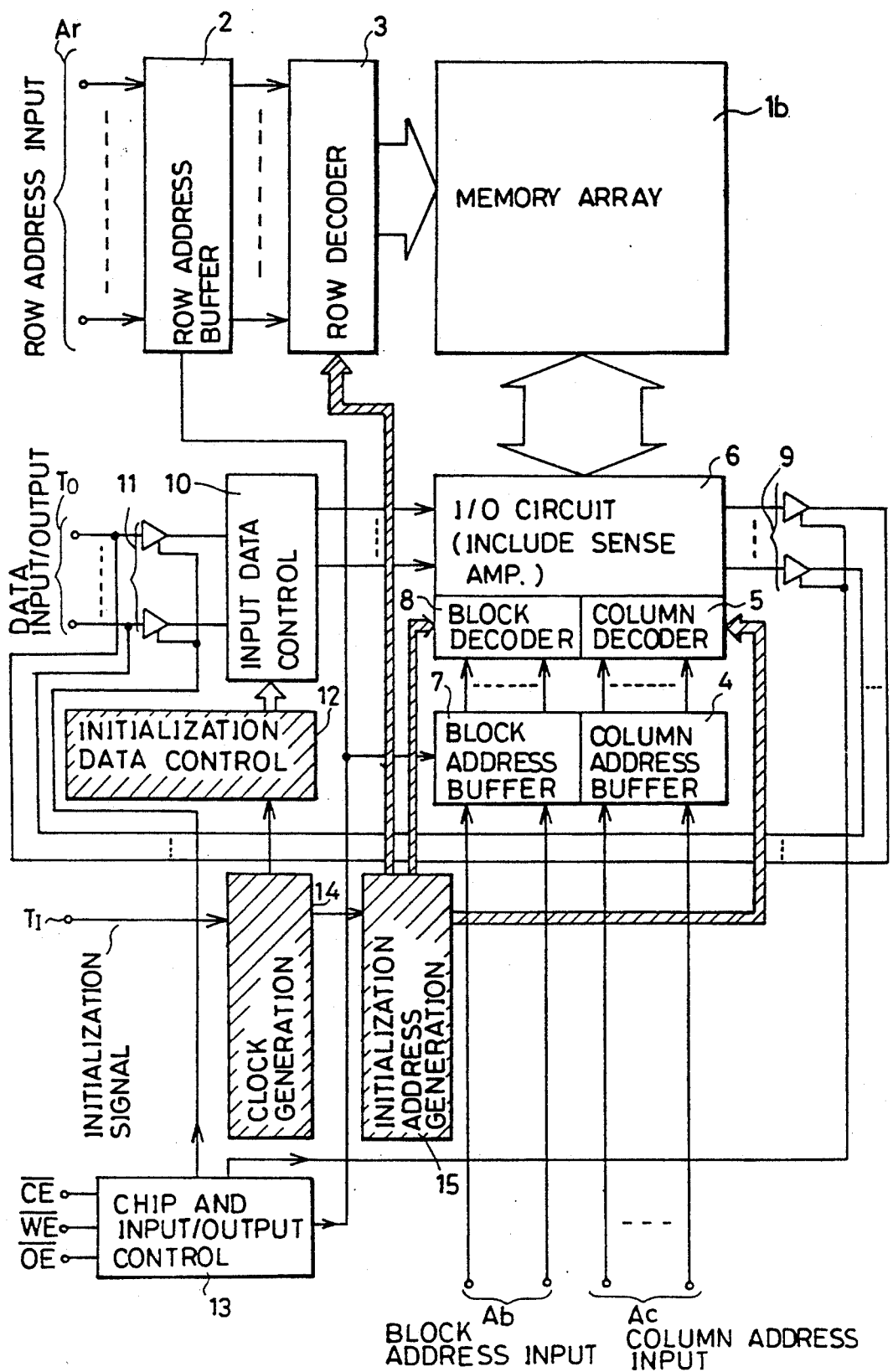
FIG. 14 is a schematic block diagram showing an entire arrangement of a conventional SRAM having a function of initializing storage data of a memory array by means of hardware.

With reference to FIG. 12, the entire arrangement of this SRAM is the same as that of a conventional general SRAM, that is, it is the same as the SRAM shown in FIG. 14 with the circuits for performing initialization by means of hardware (initialization data control circuit 12, clock generation circuit 14 and initialization address generation circuit 15) eliminated therefrom. The operation of the function block shown in FIG. 12 is as described in "Description of the Background Art".

Unlike a conventional SRAM, in the SRAM for this embodiment of the present invention, a reset signal MR (hereinafter referred to as a master reset signal) is input to memory array 1a, and the reset signal MR performs another reset (hard reset) other than initialization of storage data of the SRAM for this SRAM or the system containing the same. A master reset signal MR is a one shot pulse generated in the system or in the SRAM or externally applied in response to a power supply. This one shot pulse forces a potential of a predetermined portion of a circuit in a system to a predetermined potential to be attained at the start of the use. In this embodiment, this master reset signal MR is to be generated in the SRAM.

In FIG. 12, a reset signal generation circuit 15 is for example, a circuit conventionally provided in many of semiconductor memory devices for generating a generally called power on reset signal for internal reset. Reset signal generation circuit 16 is connected to power supply Vcc and generates a "H" (logical) level signal as a master reset signal MR for a predetermined short time period in response to a rise of the potential at this power supply Vcc.

Figure 13:
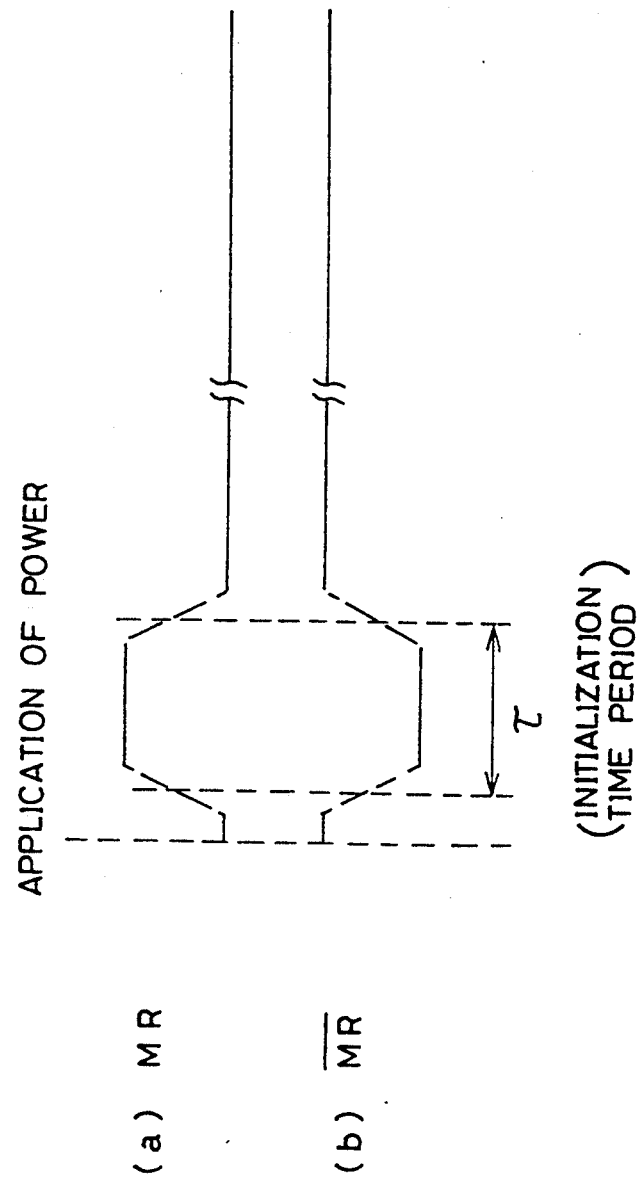
FIG. 13 is a waveform diagram of a master reset signal MR and its inversion signal $\overline{MR}$.

FIG. 13 is the diagram showing waveforms of a master reset signal MR and its inversion signal $\overline{MR}$. As shown in FIG. 13(a), after a predetermined time after the rise to a "H" level in response to he power supply, the master reset signal MR falls to a "L" level at which the signal is maintained thereafter. As a result, after the predetermined time period after the fall to a "L" level in response to the power supply, the inversion signal $\overline{MR}$ of the master reset signal MR rises to a "H" level as shown in FIG. 13(b). The inversion signal $\overline{MR}$ is maintained at a "H" level thereafter.

The internal arrangement of memory array 1a will be described. FIG. 1 shows one memory cell column as a representation of the internal arrangement of this memory array 1a.

With reference to FIG. 1, in this SRAM like a conventional one, memory cells in one column are connected between two bit lines BIT and $\overline{BIT}$ constituting the same bit line pair. Memory cells of each row are connected to the corresponding one word line WL.

Unlike the conventional one, however, each of memory cells MC1 and MC2 in which storage data are to be initialized to a logical value "0" includes N channel MOS transistors for initialization (hereinafter referred to as initialization transistors) TR3 and TR4 in addition to two inverters INV1 and INV2 constituting a latch circuit for maintaining the written data and N channel MOS transistors TR1 and TR2 which are transfer gates for reading the storage data onto the corresponding bit line pair and transmitting the data applied onto the corresponding bit line to the latch circuit.

The transistor TR3 is provided between the input end of one inverter INV2 constituting the latch circuit and power supply Vcc, and the transistor TR4 is provided between the input end of the other inverter INV1 and ground GND. The gates of transistors TR3 and TR4 receive the above-described master reset signal MR from reset signal generation circuit 16 of FIG. 12. The application of maser reset signal MR to the gates of both transistors TR3 and TR4 turns on transistors TR3 and TR4 in memory cells MC1 and MC2. The conduction of transistor TR4 and TR3 develops a voltage drop at the input end of inverter INV1 in response to the low potential at ground GND and develops a voltage rise at the input end of inverter INV2 in response to the high potential at power supply Vcc. As a result, the potential at the input end of inverter INV1 exceeds the threshold voltage of inverter INV1, whereby inverter INV applies a "H" level potential to the input end of inverter INV2. Similarly, the potential at the input end of inverter INV2 exceeds the threshold voltage of inverter INV2, whereby inverter INV2 applies a "L" level potential to the input end of inverter INV1. Consequently, the potentials at the output ends of inverters INV1 and INV2 are settled to a "H" level and a "L" level, respectively.

When the power is on, the operations of row address buffer 2, column address buffer 4 and block address buffer 7 of FIG. 12 are disabled and therefore, neither a word line WL nor a bit line pair is selected in memory array 1a. Accordingly, transfer gates TR1 and TR2 are turned off in any memory cell, so that the potentials at the nodes between inverters INV1 and INV2 are determined only by the potentials transmitted by the turned-on transistors TR3 and TR4 in memory cells MC1 and MC2 of FIG. 1.

The master reset signal MR, which is a one shot pulse, returns to a "L" level after attaining a "H" level for a predetermined short time period. In response thereto, transistors TR3 and TR4 are turned off to electrically cut off inverters INV1 and INV2 from power supply Vcc and ground GND. However, since inverters INV1 and INV2 constitute the latch circuit, the potentials at these nodes, that is, at the storage nodes n1 and n2, are maintained at the level settled when the master reset signal MR is at a "H" level. The storage data of memory cells MC1 and MC2 is initialized to a logical value "0" in this way when the power is applied.

Like the above-described memory cells MC1 and MC2, a memory cell MC3 in which storage data is to be initialized to a logical value "H" includes transistors TR3 and TR4 each having a gate for receiving a master reset signal MR, in addition to inverters INV1 and INV2 and transfer gates TR1 and TR2. Differently from memory cells MC1 and MC2, however, in memory cell MC3, transistor TR3 connected to power supply Vcc is provided at the input end side of inverter INV1 and transistor TR4 connected to ground GND is provided at the input end side of inverter INV2. In other words, transistor TR3 is connected between power supply Vcc and the input end of inverter INV1 and transistor TR4 is connected between ground GND and the input end of inverter INV2. The potential at storage node n1 is therefore settled to a "L" level in response to a low potential at ground GND and the output potential of inverter INV1, and the potential at storage node n2 is settled to a "H" level in response to a high potential at power supply Vcc and the output potential of inverter INV2 during a period of the application of the master reset signal MR. Then, when the master reset signal MR returns to a "L" level and transistors TR3 and TR4 are turned off, the inverting operations of inverters INV1 and INV2 maintain the potential levels of storage nodes n1 and n2 at the settled potentials. As described in the foregoing, in memory cell MC3, the maintained potential on the corresponding bit line BIT (the potential at the input end of inverter INV1) attains a "H" level and the maintained potential on the other corresponding bit line $\overline{BIT}$ (the potential maintained at storage node n1) attains a "L" level in response to the master reset signal MR. That is, the storage data of memory cell MC3 is initialized to "1" when power is turned on.

Inverters INV1 and INV2 and transistors TR3 and TR4 are structured to have such characteristics that a time, necessary for the potential of node n2 settled by the voltage drop or the voltage rise in response to the master reset signal MR to exceed the threshold voltage of inverter INV1 to attain the potential corresponding to the initialization data is longer than the signal delay time of inverter INV1 and that a time necessary for the potential of node n1 settled by the voltage drop or the voltage rise in response to the master reset signal MR to exceed the threshold voltage of inverter INV2 to attain the potential corresponding to the initialization data is longer than the signal delay time of inverter INV2. Thus, inverters INV1 and INV2 reliably output voltages of the levels corresponding to initialization data in response to the master reset signal MR.

A memory cell requires initialization and has the same arrangement as that of a conventional one without using transistor TR3 and TR4 for initialization. Memory cell MC4 is not therefore affected at all by a master reset signal MR and unlike the above-described memory cells MC1 to MC3, the storage data of memory cell MC4 is not initialized when power is turned on.

As described in the foregoing, according to an embodiment of the present invention, memory cells to be initialized out of all the memory cells constituting memory array 1a of FIG. 7 are provided with two transistors TR3 and TR4 for initialization which conduct in response to a master reset signal MR arranged at the positions corresponding to initialization data to be applied. Therefore, storage data of predetermined memory cells is initialized all at once to predetermined data in a period when the master reset MR is at a "H" level (the initialization period τ in FIG. 13) immediately after the power supply, which makes a time required for initialization constant irrespective of the number of memory cells to be initialized. This constant time is a time period required for an initialization transistor to settle potentials at storage nodes of one memory cell to correspond with initialization data. In ordinary data writing, "H" and "L" level potentials, data to be written, are transmitted from data input/output terminal $T_D$ of FIG. 12 to the selected bit line pair in the memory array through many circuits such as a buffer and a decoder. In initialization, the "H" and "L" level potentials to be written are directly applied to the storage nodes only through initialization transistors TR3 and TR4. A time required for initialization transistors TR3 and TR4 to transmit the "H" and "L" level potentials to the storage nodes is shorter than a time (one reading cycle period or one writing cycle period) required for writing data in one address in this SRAM at an ordinary data writing. Consequently, the present embodiment allows a time required for initialization for memory array 1a to be drastically reduced as compared with a conventional one.

While two transistors for initialization are provided for one memory cell to be initialized according to the present embodiment, the storage data of the memory cell can be initialized to arbitrary data even with one transistor.

FIG. 2 is the circuit diagram showing an arrangement of a memory cell employing a single transistor for initialization and the diagram shows another embodiment of the present invention. FIG. 2 shows an arrangement of a memory cell in which storage data is to be initialized to a logical value "0" and an arrangement of a memory cell which storage data is to be initialized to a logical value "1".

Referring to FIG. 2(a), this memory cell MC5 does not include an initialization transistor TR3 which is included in memory cells MC1 and MC2. A rise of a master reset signal MR to a "H" level turns on another initialization transistor TR4 to lower the potential at storage node n2 to a "L" level in response to ground GND. The "L" level potential at this storage node n2 is inverted by inverter INV1 and the inverted signal is output to the other storage node n1, to settle and establish the potential at storage node n1 to a "H" level. While a fall of the master reset signal MR to a "L" level turns off initialization transistor TR4, the potential at storage node n2 is maintained at a "L" level by the output of inverter INV1 for inverting the "H" level potential at storage node n2. The potentials at storage nodes n1 and n2 are accordingly maintained at a "H" level and a "L" level, respectively, even after the fall of the master reset signal MR. The storage data of this memory cell MC5 is initialized to a logical value "0" in response to the master reset signal MR in this way.

Inverters INV1 and INV2 and initialization transistor TR4 are structured to have a characteristic that the time is longer than a signal delay time in inverter INV1, which time is necessary for the potential at storage node n2 to exceed the threshold voltage of inverter INV1 to attain a "L" level in response to a master reset signal MR during a period when the master reset signal MR is at a "H" level. This enables the potentials at storage nodes n1 and n2 to reliably attain a "H" level and a "L" level, respectively, when the master reset signal MR is at a "H" level.

Differently from the above, in a memory cell MC6 which storage data is to be initialized to a logical value "1", N channel MOS transistor TR4 as an initialization transistor should be provided between storage node n1 and ground GND as shown in FIG. 2(b). In this case, the turned-on initialization transistor TR4 is lowered to a "L" level in response to the potential at ground GND when the master reset signal MR is at a "H" level. In response thereto, the output of inverter INV2 is inverted to a "H" level, and settles the potential at the other storage node n1 to a "L" level. Then, when the master reset signal MR falls to a "L" level, the inverting operations of inverters INV1 and INV2 maintain the potentials at storage nodes n1 and n2 at the potential settled when the master reset signal MR is at a "H" level. That is, the data of this memory cell MC6 is initialized to a logical value "1".

Also in this case, inverters INV1 and INV2 and initialization transistor TR4 are arranged to have such a characteristic that the potentials at storage nodes n1 and n2 reliably change as described above during a period when the master reset signal MR is at a "H" level.

While in the above-described embodiment, an initialization transistor is for lowering a potential at a storage node, the initialization transistor may also raise the potential at the storage node in response to a master reset signal. FIGS. 3(a) and (b) are circuit diagrams showing arrangements of memory cells requiring initialization in such a case and show further embodiments of the present invention.

Referring to FIG. 3(a), a memory cell MC7 in which storage data is to be initialized to a logical value "0" has the arrangement shown in FIG. 1 from which initialization transistor TR4 is removed from memory cells MC1 and MC2. In this memory cell MC7, initialization transistor TR3 conducts in a period when the master reset signal MR is at a "H", for thereby raising the potential at storage node n1 to a "H" level in response to power supply Vcc. The potential at storage node n2 accordingly attains a "L" level in response to the output of inverter INV2 for inverting the "H" level potential at storage node n1. As a result, the storage data in this memory cell MC7 is also initialized to a logical value "0" in response to the master reset signal MR.

Referring to FIG. 3(b), which is different from the memory cell in FIG. 3(a), a transistor TR3 is provided between a storage node n2 and power supply Vcc in a memory cell MC8 in which storage data is initialized to a logical value "1". In this case, potentials at storage nodes n1 and n2 are settled to "L" and "H", respectively, in a period when a master reset signal MR is at a "H" level.

Also in this case, inverters INV1 and INV2 and initialization transistor TR3 are structured to have such a characteristic as allowing the above-described potential change to be reliably caused at storage nodes n1 and n2 in a period when the master reset signal MR is at a "H" level.

While the description is made of a case where only an N channel MOS transistor is used as an initialization transistor in the embodiments shown in FIGS. 1 to 3, a P channel MOS transistor may be used.

FIG. 4 is the circuit diagram showing an arrangement of a memory cell using an N channel MOS transistor and a P channel MOS transistor as initialization transistors and the diagram shows a still further embodiment of the present invention.

Referring to FIG. 4(a), a memory cell MC9 in which storage data is to be initialized to a logical value "0" has the same arrangement as those of memory cells MC1 and MC2 of FIG. 1 wherein N channel MOS transistors TR3 are replaced by P channel MOS transistors TR5. In this case, the gate of transistor TR4 directly receives a master reset signal MR as an input and the gate of transistor TR5 directly receives an inversion signal $\overline{MR}$ of the master reset signal MR as an input. This inversion signal $\overline{MR}$ can be obtained by inverting the master reset signal MR output from reset signal generation circuit 16 of FIG. 12 by using an inverter (not shown) or the like or by generating a master reset signal as a complementary signal pair in reset signal generation circuit 16.

In this embodiment, the master reset signal MR is a "H" one shot pulse and its inversion signal $\overline{MR}$ is accordingly a "L" level one shot pulse which conversely attains a "L" level when the master reset signal MR is at a "H" level. Both transistors TR5 and TR4 are turned on when the master reset signal MR is at a "H", and consequently transistor TR5 supplies the potential at power supply Vcc to storage node n1 to raise the potential of the same to a "H" level and transistor T4 lowers the potential at storage node n2 to a "L" level in response to the potential at ground GND. Then, when the master reset signal MR falls to a "L" (when the inversion signal $\overline{MR}$ raises to a "H" level), the potential levels of storage data in a memory cell of such arrangement to be initialized to a logical value "0" when power is turned on.

Referring to FIG. 4(b), in a memory cell MC10 in which storage data is to be initialized to a logical value "1", transistors TR4 and TR5 should b e connected to storage nodes n1 and n2, respectively, in a reverse manner to the above connection. This allows transistors TR4 and TR5 to cause storage nodes n1 and n2 to attain a "L" level and a "H" level, respectively, when the master reset signal MR is at a "H" level in response to the power supply.

While the embodiment shown in FIG. 4 employs two transistors, a P channel MOS transistor and an N channel MOS transistor as initialization transistors, only a P channel MOS transistor is used.

FIG. 5 is the circuit diagram showing an arrangement of a memory cell which can be initialized by using one P channel MOS transistor and the diagram shows a still further embodiment of the present invention.

FIGS. 5(a) and (b) have the same arrangements as those of FIGS. 4(a) and (b) with initialization transistors TR4 removed therefrom. Therefore, no complementary master reset signal pair is required but only the inversion signal $\overline{MR}$ is required in this case.

Referring to FIG. 5(a), storage node n1 is supplied with the potential at power supply Vcc to attain a "H" level while the inversion master reset signal $\overline{MR}$ attains a "L" in response to a power supply in a memory cell MC11 in which storage data is to be initialized to a logical value "0". The potential at storage node n2 accordingly attains a "L" level in response to the output of inverter INV2 which inverts the potential at storage node n1.

Conversely in a memory cell MC12 in which storage data is to be initialized to a logical value "1", a transistor TR5 is provided at storage node n2 side with reference to FIG. 5(b). The potentials at storage nodes n1 and n2 therefore attain a "L" level and a "H" level in this memory cell MC12 while the inversion master reset signal $\overline{MR}$ is at "L" level.

As described in the foregoing, it is also possible to initialize storage data of a memory cell to arbitrary data by using only a P channel MOS transistor. Also in this case, inverters INV1 and INV2, initialization transistor TR5 and the like are structured to have such a characteristic as allowing the above-described potential changes to be reliably caused at storage nodes n1 and n2 while the master reset signal MR is at "H" level.

Any of the above-described embodiments allows rapid desired initialization only by providing at least one initialization transistor at the position corresponding to the initialization data in an arbitrary memory cell to be initialized at the time of manufacturing a memory array. While two storage nodes are simultaneously forced to have the potentials corresponding to initialization data when two transistors are used as an initialization transistor, the potential of one storage node is settled after the settlement of the potential at the other storage node when one transistor is used as an initialization transistor. Therefore, the use of two transistors as initialization transistors achieves a larger reduction in an initialization time period. However, one initialization transistor results in the reduced number of elements of a memory cell, which makes the increase in area of the memory cell array smaller resulting from the addition of initialization elements. An arrangement of a memory cell to be initialized is arbitrarily selected according to uses of the semiconductor memory device.

While a master reset signal MR and its inversion signal $\overline{MR}$ are used only for controlling on/off of an initialization transistor in any of the above-described embodiments, they can be used as data to be written in a memory cell for initialization.

Figure 6:
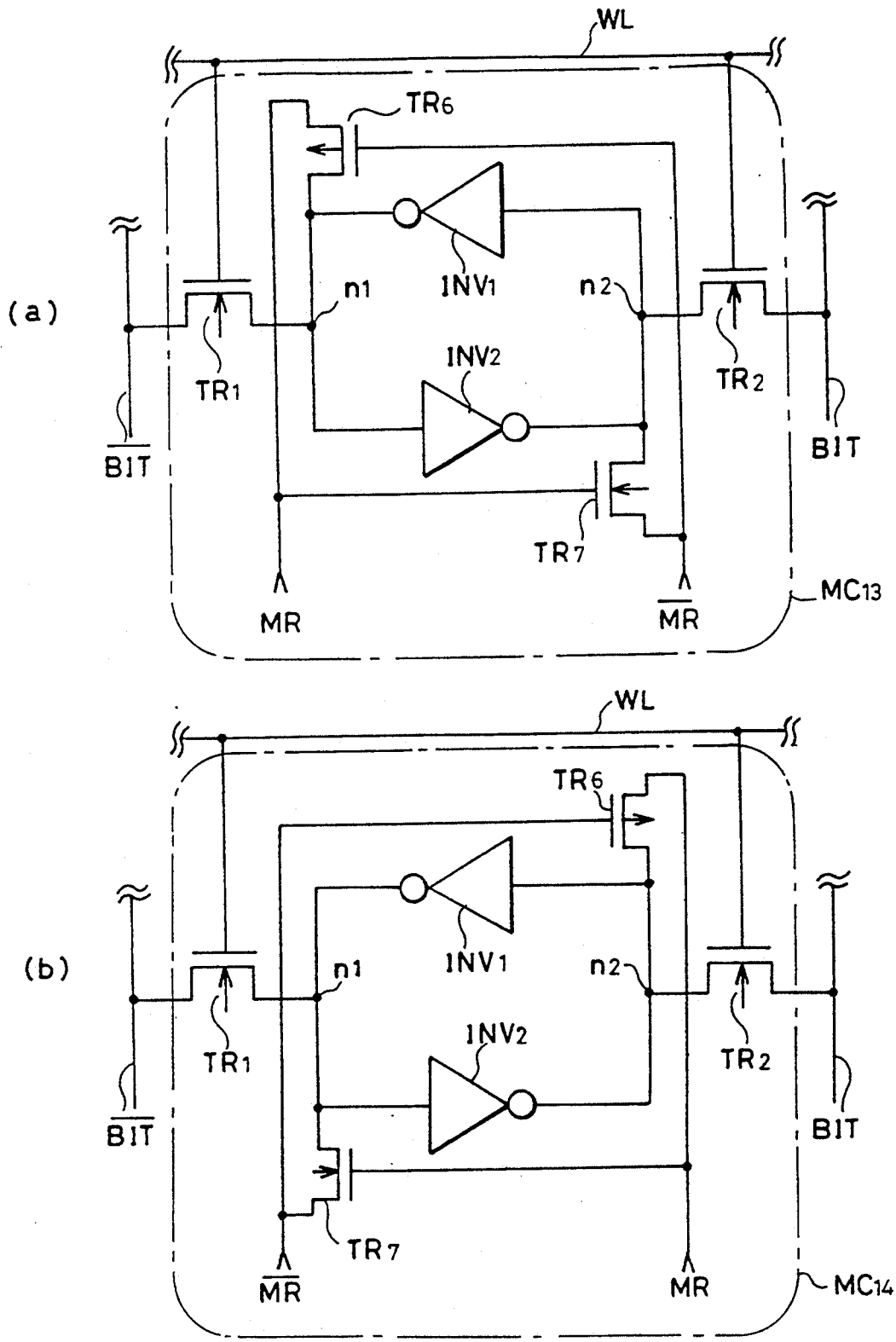
FIGS. 6a and b are circuit diagrams showing an arrangement of a memory cell according to a still further embodiment of the present invention.

FIG. 6 is the circuit diagram showing arrangements of memory cells capable of accepting a master reset signal MR and its inversion signal $\overline{MR}$ as data for initialization according to a still further embodiment of the present invention.

Referring to FIG. 6(a), memory cell MC13 includes a P channel MOS transistor TR6 and an N channel MOS transistor TR7 as initialization transistors in addition to inverters INV1 and INV2 constituting a flip-flop and transfer gates TR1 and TR2. Transistor TR6 is connected between the output end of inverter INV1 and the gate of transistor TR7. Transistor TR7 is connected between the output end of inverter INV2 and the gate of transistor TR6. The gates of transistors TR7 and TR6 receive a master reset signal MR and its inversion signal $\overline{MR}$, respectively.

When the master reset signal MR and its inversion signal $\overline{MR}$ attain a "H" level and a "L" level, respectively, at a power on, transistors TR6 and TR7 conduct in response to the inversion signal $\overline{MR}$ and the master set signal MR, respectively, for thereby applying the master reset signal MR to the input end of inverter INV2 through transistor TR6 and the inversion signal $\overline{MR}$ to the input end of inverter INV1 through transistor TR7. As a result, the potential at storage node n1 rises and the potential at storage node n2 falls. Like the embodiment shown in FIG. 4(a), the potentials at storage nodes n1 and n2 are therefore forced to a "H" level and a "L", respectively, for a short time period when the master reset signal MR is at "H" level by arranging inverters INV1 and INV2 and transistors TR6 and TR7 to have such characteristics that the time required for the potential at storage node n1 to attain a "H" level after the starts of its rise in response to the potential of the master reset signal MR is longer than the signal delay time of inverter INV1 and the time required for the potential at storage node n2 to attain a "L" level after the start of its fall in response to the inversion signal $\overline{MR}$ being longer than the signal delay time of inverter INV2. Transistors TR6 and TR7 become nonconductive in response to the master reset signal MR and its inversion signal $\overline{MR}$ returning to a "L" level and a "H" level, respectively. As a result, the master reset signal MR and the inversion signal $\overline{MR}$ are electrically disconnected from inverters INV1 and INV2. However, the potentials at storage nodes n1 and n2 are maintained at the forced "H" level and "L" level potentials, respectively, by inversion operation of inverters INV1 and INV2. In other words, the storage data of memory cell MC13 is initialized to a logical value "0" in response to the power supply.

Conversely, memory cell MC14 in which storage data is to be initialized to a logical value "1" when power is supplied should be arranged as shown in FIG. 6(b). That is, transistor TR6 to be coupled to the master reset signal MR is provided at the side of storage node n2 and transistor TR7 to be coupled to the inversion signal $\overline{MR}$ of the master reset signal MR is provided at storage node n1, in a different connection from the above-described case. In this memory cell MC14, the potential at storage node n1 is forced to a "L" level in response to he inversion signal $\overline{MR}$ of the master reset signal MR is provided at storage node n1, in a different connection from the above-described case. In this memory cell MC14, the potential at storage node n1 is forced to a "L" level in response to the inversion signal $\overline{MR}$ and the potential at storage node n2 is forced to a "H" level in response to a potential of the master reset signal MR while the master reset signal MR is at "H" level.

At least one of two storage nodes of each memory cell in which storage data is to be initialized is directly forced to the potential corresponding to initialization data according to the above-described embodiments. In addition, the potential of at least one of the two storage nodes can be indirectly forced to the potential corresponding to the initialization data by using the master reset signal MR or its inversion signal $\overline{MR}$.

FIG. 7 is the circuit diagram showing arrangements of a memory cell in which a potential at a storage node can be indirectly forced to a potential corresponding to initialization data in response to a master reset signal MR or its inversion signal $\overline{MR}$.

Figure 15:
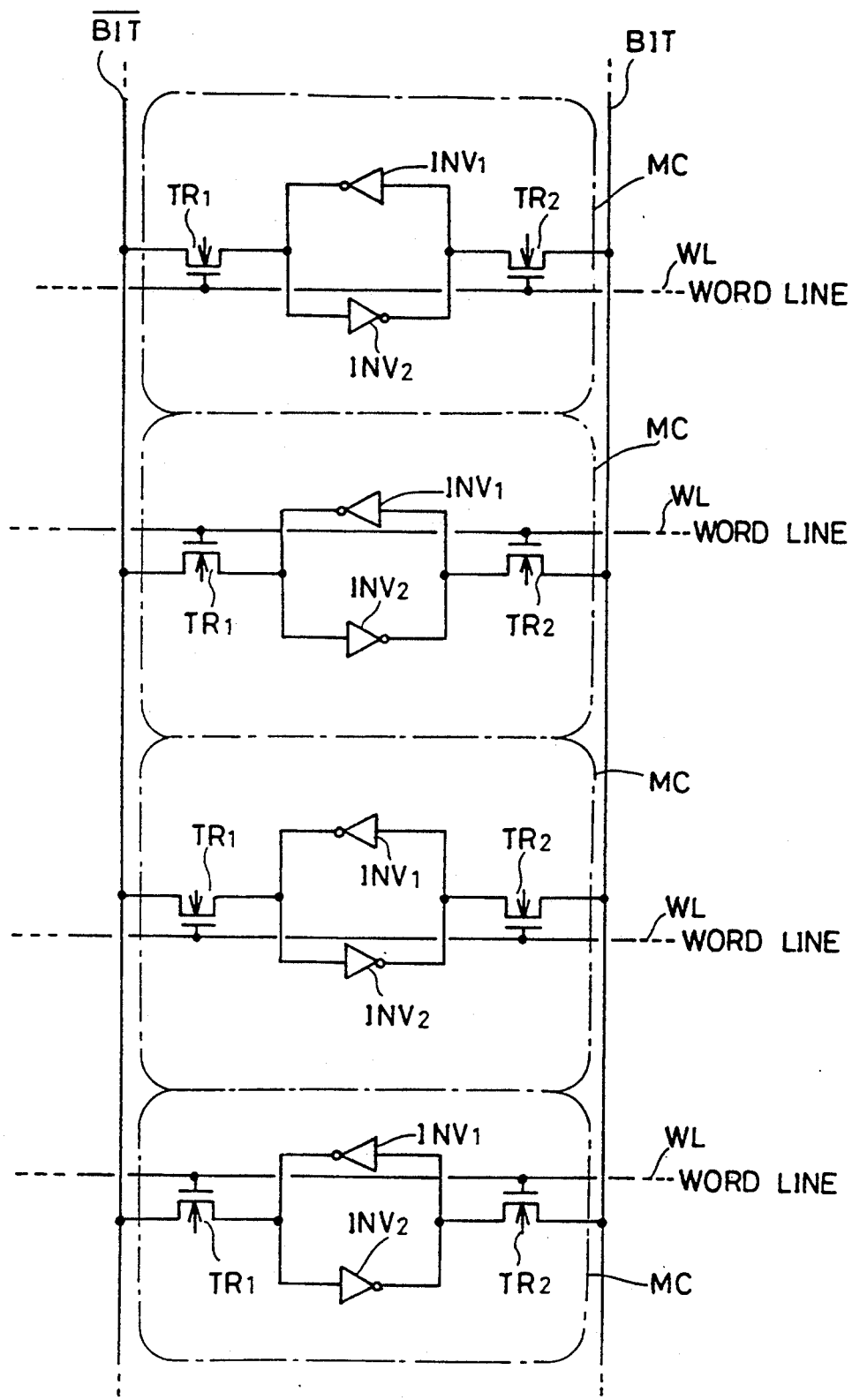
FIG. 15 is a partial circuit diagram of a memory array in a conventional SRAM.
Figure 16:
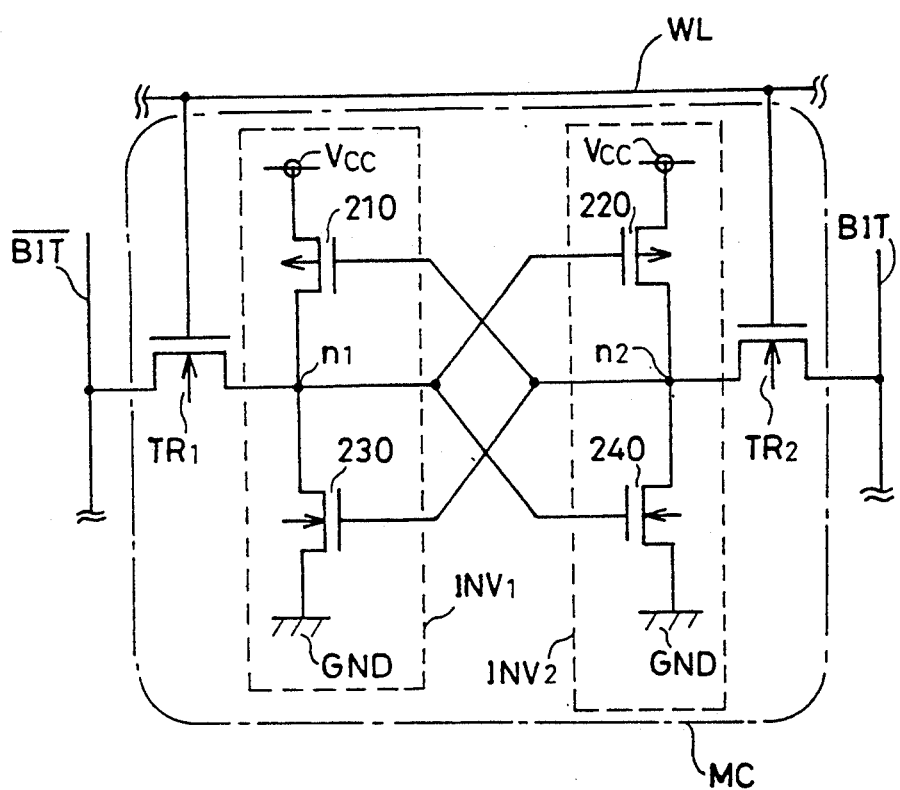
FIG. 16 is a circuit diagram showing an arrangement of a memory cell of a conventional SRAM in detail.

Referring to FIG. 7(a), a memory cell MC15 includes a two-input NAND gate ND1 in place of inverters INV1 in memory cells MC1-MC14 shown in FIGS. 1 to 6. The arrangement of the other part of memory cell MC15 is the same as that of the conventional memory cell MC shown in FIG. 15. One input end of NAND gate ND1 is connected to storage node n2 and the output end of NAND gate ND1 is connected to storage node n1. The other input end of NAND gate ND1 receives an inversion signal $\overline{MR}$ of a master reset signal MR.

When the potential of at least one of the input ends is at "L" level, the output logical level of the NAND gate attains a "H" level irrespective of the potential of the other input end. The output potential of NAND gate NDD1 is therefore fixed to an "H" level in memory cell MC15 when the potential of the inversion signal $\overline{MR}$ is at "L" level. Conversely, when the potential of the inversion signal $\overline{MR}$ is at "H" level, the output potential of NAND gate ND1 depends on the potential level of the input end not receiving inversion signal $\overline{MR}$ of NAND gate ND1, that is, on the potential level of storage node n2. In other words, when the potential at storage node n2 is at "H" level, NAND gate ND1 outputs a "L" level potential and when the potential at storage node n2 is at a "L" level, NAND gate ND1 outputs a "H" level potential. As described in the foregoing, NAND gate ND1 operates as an inverter when the potential of an inversion signal $\overline{MR}$ is at a "H" level and outputs a "H" level potential irrespective of the potential level of storage node n2 only when the potential of an inversion signal $\overline{MR}$ is "L" level. The potential at storage node n1 is accordingly fixed to a "H" level in response to the output potential of NAND gate ND1 when the inversion signal $\overline{MR}$ attains a "L" level in response to a power supply. The potential level of this storage node n1 is inverted by inverter INV2 and then transmitted to storage node n2. As a result, the potential at storage node n2 is fixed to a "L" level. The output potential of NAND gate ND1 is brought to a state in which the same can be changed in response to the potential level of storage node n2 when the inversion signal $\overline{MR}$ returns to a "H" level. However, it is only when the potentials on bit lines BIT and $\overline{BIT}$ are applied to storage nodes n1 and n2 through transfer gates TR1 and TR2, respectively, that the potential levels of storage nodes n1 and n2 are changed thereafter. When the potential of the inversion signal $\overline{MR}$ is "H", NAND gate ND1 operates as an inverter. The potentials at storage nodes n1 and n2 are accordingly maintained at a "H" level and a "L" level, respectively, in response to the inversion of NAND gate ND1 and inverter INV1 until additional data is externally applied to storage nodes n1 and n2 in an ordinary data writing.

As described in the foregoing, the storage data of memory cell MC15 is initialized to a logical value "0" by indirectly forcing the potential level of storage node n1 to an "H" level in a period when an inversion signal $\overline{MR}$ of a master reset signal is at "L" level according to the present embodiment.

Conversely, a memory cell MC16 in which storage data is to be initialized to a logical value "1" should be structured as shown in FIG. 7(b), for example. That is, memory cell MC16 includes a simple inverter in place of NAND gate ND1 of FIG. 7(a) and a two-input NAND gate ND1 for receiving an inversion signal $\overline{MR}$ as an input in place of inverter INV2 of FIG. 7(a). In this case, the potential at storage node n2 is fixed to a "H" level in a period when an inversion signal $\overline{MR}$ attains a "L" in response to a power supply. NAND gate ND1 operates as a simple inverter in the other periods. Accordingly, after once being forced to a "L" level and a "H" level in response to a power supply, the potentials at storage nodes n1 and n2 are brought to a state in which they can be changed in response to the potentials on bit lines BIT and $\overline{BIT}$ when transfer gates TR1 and TR2 are turned on.

While one of inverters INV1 and INV2 constituting a flip-flop in a memory cell is replaced by an NAND gate according to the embodiment shown in FIG. 7, one of inverters INV1 and INV2 can be replaced by an NOR gate to initialize the potential levels of storage nodes n1 and n2 if a master reset signal MR is used.

FIG. 8 is the circuit diagram showing arrangements of a memory cell for which storage data can be initialized in such manner and the circuit diagram shows a still further embodiment of the present invention.

With reference to FIG. 8(a), a memory cell MC17 includes a two-input NOR gate in place of NAND gate ND1 and a master reset signal MR in place of an inversion signal $\overline{MR}$ in FIG. 7(b). An NOR gate NR1 outputs a "L" level potential irrespective of the potential level of storage node n1 when the potential of the master reset signal MR is at a "H" level. When the potential of the master reset signal MR is "L", NOR gate NR1 operates as an inverter to output the potential of the logical level opposite to the potential level of storage node n1. The potential at storage node n2 is accordingly fixed to a "L" level in response to the output potential of NOR gate NR1 when the master reset signal MR attains "H" in response to the power supply. In response thereto, the potential at storage node n1 is fixed to a "H" level in response to the output potential of inverter INV1. The potential levels of storage nodes n1 and n2 are brought to a state in which they can be changed only in response to an external data in the ordinary data writing, when the potential of master reset signal MR returns to a "L" level. As described in the foregoing, an NOR gate also enables initialization of storage data of a memory cell to a logical value "0".

With reference to FIG. 8(b), a memory cell MC18 in which storage data is to be initialized to a logical value "1" includes a two-input NOR gate NR1 in place of NAND gate ND1 and a master reset signal MR in place of an inversion signal $\overline{MR}$ in memory cell MC15 shown in FIG. 7(a). In this case, the potential at storage node n1 is fixed to a "L" level in response to the output of NOR gate NR1 when a master reset signal MR attains a "H" level in response to a power supply. In contrast with the previous case, the potentials at storage node n1 and n2 are once forced to a "L" level and "H" level in response to the power supply.

As described in the foregoing, a logical circuit constituting a flip-flop for maintaining potentials at storage nodes n1 and n2 is directly controlled by a master reset signal MR or its inversion signal $\overline{MR}$ in the embodiments shown in FIGS. 7 and 8. The time required for the potentials at storage nodes n1 and n2 to be forced to the levels corresponding to initialization data is therefor equal to a time required for the potentials at storage nodes n1 and n2 to attain the output potential level of the logical circuit constituting a flip-flop (more specifically, inverters INV1 and INV2, NAND gate ND1 and NOR gate NR1). This means that the period, when the potential of the master reset signal MR is at a "H" level, should be set to the order of a signal delay time in the logical circuit. Thus, the embodiments shown in FIGS. 7 and 8 enable initialization of storage data of a memory cell at a higher speed.

Each of NAND gate ND1 and NOR gate NR1 shown in FIGS. 7 and 8 requires eight transistors when it includes an MOS transistor, for example. However, each of these logical gates can be structured by seven MOS transistors if both a master reset signal MR and its inversion signal $\overline{MR}$ are used.

Figure 9:
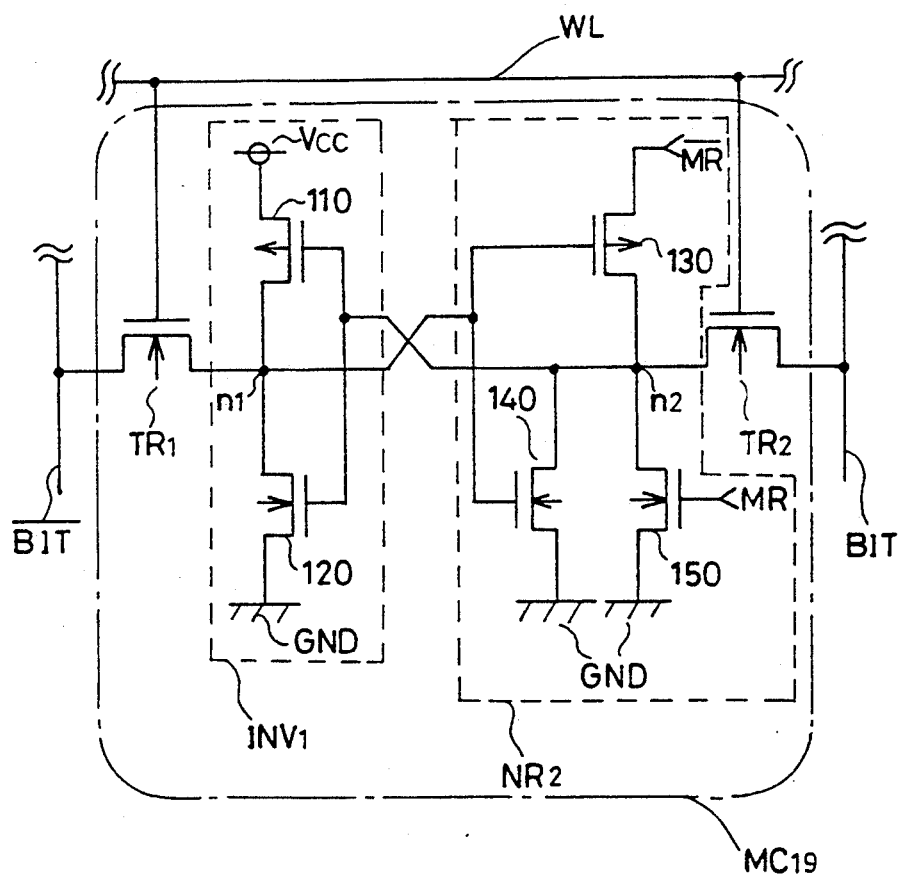
FIG. 9 is a circuit diagram showing an arrangement of a memory cell according to a still further embodiment of the present invention.

FIG. 9 is the circuit diagram showing in detail the arrangement of a memory cell MC19 achieving the same logical operation as that of memory cell MC17 shown in FIG. 8(a) by using the reduced number of transistors and the circuit diagram shows a still further embodiment of the present invention. With reference to FIG. 9, inverter INV1 shown in FIG. 8(a) is a generally called CMOS inverter including a P channel MOS transistor 110 and an N channel MOS transistor 120 connected in series between power supply Vcc and ground GND. The connection point between transistors 110 and 120 is a storage node n1. NOR gate NR2 includes a P channel MOS transistor 130 and an N channel MOS 140 each having a gate connected to storage node n1 an N channel MOS transistor 150 arranged between transistor 130 and ground GND. Transistor 140 is arranged between the connection point between transistors 130 and 150 and ground GND. The connection point between transistors 130 and 150 is connected to the gate connection point between transistors 110 and 120, which is the point for the input end of inverter INV1. The connection point between transistors 130 and 150 is the output end of NOR gate NR2, that is, storage node n2. The gate of transistor 150 receives a master reset signal MR and the source of transistor 130 receives an inversion signal $\overline{MR}$ of the master reset signal MR.

In FIG. 9, transistor 150 conducts when a master reset signal MR is at a "H" level. Accordingly, current flows from storage node n2 to ground GND if even transistor 140 is non-conductive. When the master reset signal MR is at an "H" level, its inversion signal $\overline{MR}$ is at an "L" level. A "L" potential is therefore applied to storage node n2 even if transistor 130 is conductive. Therefore, the potential at storage node n2 attains a "L" level irrespective of gate potentials of transistors 130 and 140 when a master reset signal MR is at a "H" level. When the potential at storage node n2 attains a "L" level, transistor 110 conducts to transmit the potential of power supply Vcc to storage node n1 in inverter INV1, and consequently the potential at storage node n1 attains an "H" level.

Transistor 150 is non-conductive when a master reset signal MR is at a "L" level. Meanwhile, its inversion signal $\overline{MR}$ is at a "H" level when the master reset signal MR is at a "L" level, so that the source potential of transistor 130 attains a "H" level. Similar to transistors 110 and 120, transistors 130 and 140 function as CMOS inverters.

As described in the foregoing section, the memory cell equivalent in operation to memory cell MC17 shown in FIG. 8(a) can be achieved also by the present embodiment. In order to embody the same logical operation as that of memory cell MC18 shown in FIG. 8(b) by using the reduced number of transistors, inverter INV1 and NOR gate NR2 of such an arrangement as shown in FIG. 9 should be used in inverter INV2 and NOR gate NR1 of FIG. 8(b).

Figure 10:
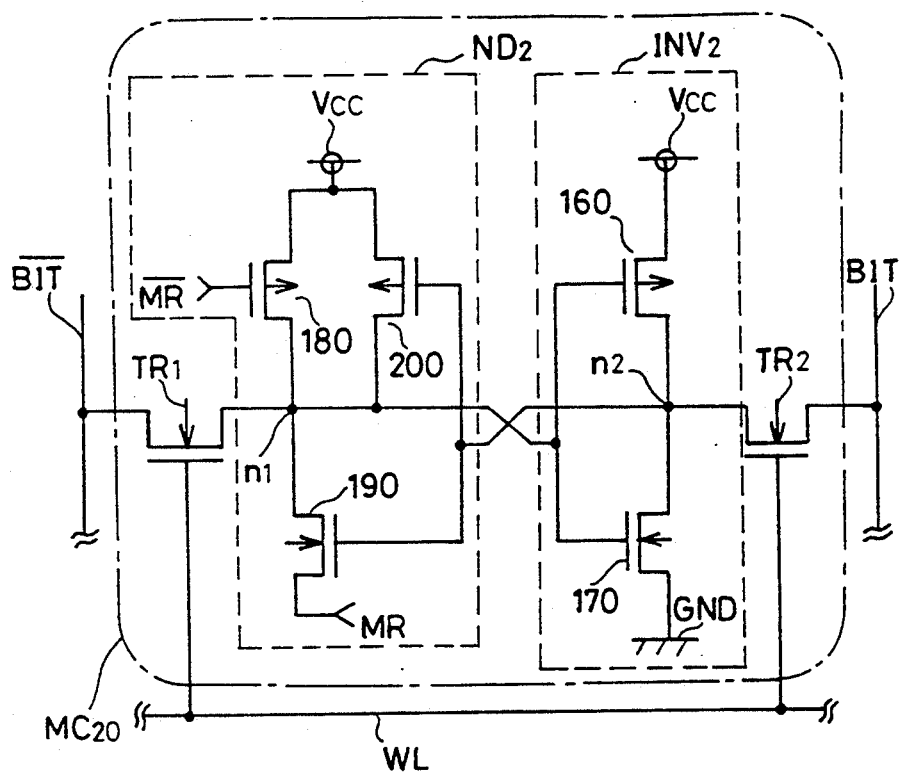

FIG. 10 is the circuit diagram showing in detail the arrangement of a memory cell MC20 embodying the same logical operation as that of memory cell MC15 shown in FIG. 7(a) by using the reduced number of transistors, and the diagram shows a still further embodiment of the present invention. With reference to FIG. 10, inverter INV2 shown in FIG. 7(a) is a CMOS inverter including a P channel MOS transistor 160 and an N channel MOS transistor 170 connected in series between power supply Vcc and ground GND. The connection point between transistors 160 and 170 is a storage node n2. NAND gate ND2 includes an N channel MOS transistor 190 and a P channel MOS transistor 200 each having a gate connected to storage node n2 and a P channel MOS transistor 180 provided between power supply Vcc and transistor 190. Transistor 200 is arranged between power supply Vcc and the input end of inverter INV2, that is, the gate connection point between transistors 160 and 170. The connection point between transistors 180 and 190 is the output end of this NAND gate ND2, that is, storage node n1. The source of transistor 190 receives a master reset signal MR and the gate of transistor 180 receives an inversion signal $\overline{MR}$ of the master reset signal MR.

In FIG. 10, transistor 180 conducts when the inversion signal $\overline{MR}$ of the master reset signal MR is at a "L" level. Current therefore flows from power supply Vcc to storage node n1 even when transistor 200 is non-conductive. Meanwhile, the master reset signal MR is at a "H" level when the inversion signal $\overline{MR}$ is at a "L" level, so that the potential at storage node n1 attains a "H" level even when transistor 190 is conductive. The potential at storage node n1 therefore attains a "H" level irrespective of the gate potentials of transistors 190 and 200 when the inversion signal $\overline{MR}$ is at a "L" level. When the potential at storage node n1 is at a "H" level transistor 170 conducts in inverter INV2, so that the potential at storage node n2 attains a "L" level.

Transistor 180 is non-conductive in a period when the inversion signal $\overline{MR}$ is at a "H" Level. The master reset signal MR is at a "L" level in this period, so that the source potential of transistor 190 attains a "L" level. As a result, transistors 190 and 200 operate as CMOS inverters similar to transistors 160 and 170.

The memory cell equivalent in operation to memory cell MC15 having the arrangement shown in FIG. 7(a) can be obtained also by the present embodiment. In order to embody the same logical operation as that of memory cell MC16 shown in FIG. 7(b) by using the reduced number of 7(b) should be structured similarly to inverter INV2 and NAND gate ND2 shown in FIG. 10, for example.

As described in the foregoing, the reduced number of elements enables initialization of storage data of a memory cell through two control signals (MR and $\overline{MR}$) which are necessary according to the embodiments shown in FIGS. 9 and 10. These embodiments therefore can prevent the increase in memory size resulting from the addition of circuits for initialization to a conventional memory cell element.

While the description is made in all the above-described embodiments of a case where the present invention applied to an SRAM including a latch circuit having two inverters, the present invention is also applicable to such a semiconductor memory device having a memory cell of an internal arrangement basically different from that of SRAM such as a DRAM (Dynamic Random Access Memory). FIG. 11 is the circuit diagram showing the internal arrangement of the memory cell of a DRAM to which the present invention is applied and the circuit diagram shows a still further embodiment of the present invention.

With reference to FIG. 11(a), a memory cell $MC_{D3}$ of a DRAM conventionally includes an N channel MOS transistor TR8 and a memory capacitor C connected in series between a bit line BIT and a cell plate CP fixed to a predetermined low potential. The gate of the transistor TR8 is connected to the word line WL. As in the case of an SRAM, a "H" level voltage is applied onto the word line WL to turn on transistor TR8 in an ordinary data writing. At the same time, the potential corresponding to the data to be written to (the potential level "L" corresponding to a logical value "0" or the potential level corresponding to a logical value "1") is applied onto the bit line BIT. As a result, the potential corresponding to the data to be written is transmitted to a transfer gate a connection point n3 between transistor TR8, which is connecting a bit line and a memory cell, and memory capacitor C through transistor TR8. Memory capacitor C is charged when the potential is at a "H" level and conversely memory capacitor C is discharged when the potential is at a "L". In the DRAM, data is written in storage node n3 by discharging or charging the capacitor in the memory cell in this way. The potential on word line WL returns to an "L" level when the writing is finished, so that transistor TR8 is turned off, while the potential at storage node n3 is maintained for a time period (ordinarily several hundreds of milliseconds) corresponding to the capacitance of memory capacitor C.

Initialization of storage data of a memory cell having such an arrangement according to the present invention requires, for example, an N channel MOS transistor TR9 having a gate and a drain for receiving such a master reset signal MR as described above to be connected to storage node n3. When the master reset signal MR rises to a "H" level when power is turned on, transistor TR9 is turned on to supply a voltage of this "H" level to storage node n3. As a result, memory capacitor C is charged, so that the logical value "1" is written in memory cell as $MC_{D1}$ initialization data like in an ordinary writing. Then, when the master reset signal MR falls to a "L" level, TR9 is turned off to force the potential at storage node n3 to none of the levels. However, the potential level of storage node n3 is maintained by memory capacitor C for the time period similar to an ordinary data writing.

Conversely, while a master reset signal MR is applied to the gate of the above-described transistor TR9 for initialization as in the previous case, the drain of transistor TR9 is connected to cell plate CP, in a case of initialization of storage data of a memory cell in a DRAM to a logical value "0", with reference to FIG. 11(b), for example. As a result, the potential at storage node n3 is lowered in response to the potential of cell plate CP in a period when a master reset signal is at a "H" at the time of power is applied. In this case therefore, the potential at storage node n3 attains a "L" level to initialize the storage data of this memory cell $MC_{D2}$ to a logical value "0".

While an N channel MOS transistor is used as a transistor for initialization in the above-described two embodiments, a P channel MOS transistor can be used. In such a case, a P channel MOS transistor TR10 having a gate for receiving an inversion signal $\overline{MR}$ of a master reset signal MR and a drain for receiving a master reset signal MR is connected to storage node n3, as shown in FIG. 11(c), for example. The inversion signal $\overline{MR}$ can be obtained, for example, by inverting a master reset signal MR by inverter INV3 as described previously. When a master reset signal MR is at a "H" level, its inversion signal is at a "L" and therefore transistor TR10 is turned on in this memory cell $MC_{D3}$ in a period when master reset signal MR is at a "H' level, for thereby supplying the potential "H" Of the non-inverted master reset signal MR applied to the drain to storage node n3. As a result, the storage data of this memory cell $MC_{D3}$ is initialized to a logical value "1" in this case.

Storage data of a memory cell can be initialized to a logical value "0" also by using such complementary 10 master reset signals MR and $\overline{MR}$. In this case, a master reset signal MR does not attain a "H" level when power is applied but its inversion signal MR should be applied to the drain of transistor TR10, for example.

It is also possible to use an N channel MOS transistor as an initialization transistor in a case of initialization of storage data of a memory cell to a logical value "0" by using complementary master reset signals in this way. Referring to FIG. 11(d) for example, N channel MOS transistor TR9 is connected as an initialization transistor to storage node n3 in this memory cell $MC_{D4}$. The drain of transistor TR9 receives an inversion signal $\overline{MR}$ of a master reset signal MR and the gate thereof receives a re-inversion signal MR of this inversion signal $\overline{MR}$ by inverter INV4. Transistor TR9 therefore receives a "H" level voltage from inverter INV4 to become conductive when the master reset signal MR is at a "H" level, so that the potential at storage node n3 is lowered in response to a "L" level signal $\overline{MR}$. As a result, the storage data of this memory cell $MC_{D4}$ is initialized to a logical value "0".

As in the case of the SRAM shown in FIG. 1, the master reset signal MR and its inversion signal $\overline{MR}$ should be applied to initialization transistors in the memory cells arranged in one column connected to the same bit line through the common connection line in FIGS. 11(a)-(d).

As described above, storage data of predetermined memory cells can be simultaneously initialized in response to a power supply also in a DRAM by arranging a memory array such that a transistor for initialization is provided in each memory cell to be initialized and a master reset signal MR or its inversion signal $\overline{MR}$ is applied to the gate and the drain of this transistor for initialization in accordance with initialization data.

Although the present invention is applicable to a DRAM, a DRAM is fundamentally arranged to have a memory cell area as small as possible on a chip by using memory cell comprising circuit elements having as few as one transistor and one capacitor. The present invention therefore should be applied to a DRAM by fully considering which is more important point in view of an object of its use, the decrease in area per memory cell of the reduction in an initialization time resulting from the provision of a transistor for initialization in a memory cell.

While a master reset signal MR is a one shot pulse of a "H" level in the above-described embodiments, if a "L" level one shot pulse is used as a master reset signal MR, the same effect as described above can be achieved by using the initialization transistor having the opposite polarity to that in each of above-described embodiments.

In addition, a signal for use in designating initialization of storage data of a memory cell is not limited to a master reset signal but any of such signals generated in a chip or externally applied to the chip may be used to attain a level designating the initialization for a fixed short time period in response to a power supply.

As described in the foregoing, these embodiments allow even such complicated initialization as using irregular addresses to be initialized, and irregular initialization data or the like to be more reliably performed at a much faster speed than the conventional one only by adding a simple circuit to a conventional memory array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for initializing storage data, comprising:
    a plurality of memory cells each having a storage node location to be maintained at a potential corresponding to the storage data;
    potential forcing means provided corresponding to each of predetermined memory cells out of said plurality of memory cells for developing predetermined initialization data which initializes and forces the potential of said storage node location of the corresponding one of said predetermined memory cells to the potential corresponding to each predetermined initialization data; and
    activating means for activating said potential forcing means all at once corresponding to each of said predetermined memory cells in response to a power supply immediately after the activation of said power supply and initializing said plurality of memory cells every time that a control signal is activated for a predetermined time period so that the time required for initialization is constant irrespective of the number of memory cells to be initialized.

2. The semiconductor memory device according to claim 1, wherein said storage node location includes first and second storage nodes to be maintained at potentials complementary to each other when initializing the storage data.

3. The semiconductor memory device according to claim 2, wherein said potential forcing means includes a first switching element provided between said first storage node of each of said plurality of memory cells and a first power supply for supplying a first potential.

4. The semiconductor memory device according to claim 3, wherein said potential forcing means further includes a second switching element provided between said second storage node of each of said memory cells and a second power supply for supplying a second potential complementary to said first potential.

5. The semiconductor memory device according to claim 3, wherein said activating means includes first control signal generating means for generating a first control signal for controlling said first switching element and turning on said first switching element for a predetermined time period in response to applying a drive voltage for driving the semiconductor memory device to the same.

6. The semiconductor memory device according to claim 4, wherein said activating means includes control signal generating meas for generating first and second control signals which control said first and second switching elements, respectively, and turning on said first and second switching elements for a predetermined time period in response to applying a drive voltage for driving the semiconductor memory device to the same.

7. The semiconductor memory device according to claim 5, wherein said first switching element includes a first field effect semiconductor element of a first polarity having a control terminal for receiving said first control signal, a first conduction terminal connected to said first storage node of each of said memory cells and a second conduction terminal connected to said first power supply.

8. The semiconductor memory device according to claim 6, wherein
    said first switching element includes a first field effect semiconductor element of a first polarity having a control terminal for receiving said first control signal, a first conduction terminal connected to said first storage node of each of said memory cells and a second conduction terminal connected to said first power supply, and
    said second switching element includes a second field effect semiconductor element of a second polarity having a control terminal for receiving said second control signal, a first conduction terminal connected to said second storage node of each of said memory cells and a second conduction terminal connected to said second power supply.

9. The semiconductor memory device according to claim 6, wherein
    said first switching element includes a first field effect semiconductor element of a first polarity having a control terminal for receiving said first control signal, a first conduction terminal connected to said first storage node of each of said memory cells and a second conduction terminal or receiving said second control signal, said second switching element includes a second field effect semiconductor element of a second polarity opposite to said first polarity having a control terminal for receiving said second control signal, a first conduction terminal connected to said second storage node of each of said memory cells and a second conduction terminal for receiving said first control signal, and the potential of said first control signal and the potential of said second control signal in said predetermined time period are equal to said first potential and said second potential, respectively.

10. The semiconductor memory device according to claim 3, wherein each of said plurality of memory cells further includes first inverting means for inverting the potential at said first storage node included int he memory cell and applying the inverted potential to said second storage node included in the same memory cell and second inverting meas for inverting the potential at said second storage node included int he memory cell and applying the inverted potential to said first storage node included in the same memory cell.

11. The semiconductor memory device according to claim 4, wherein each of said plurality of memory cells further includes first inverting means for inverting the potential at said first storage node included in the memory cell and applying the inverted potential to said second storage node included in the same memory cell and second inverting means for inverting the potential at said second storage node included int he memory cell and applying the inverted potential to said first storage node included in the same memory cell.

12. The semiconductor memory device according to claim 2, wherein each of said plurality of memory cells further includes inverting means for inverting the potential at said second storage node included int eh memory cell and applying the inverted potential to said first storage node included int he same memory cell, and said potential forcing means includes supplying means provided between said first storage node of each of said predetermined memory cells and said second storage node of each of said predetermined memory cells for supplying a signal of a potential corresponding to said predetermined initialization data to said second storage node of each of said memory cells irrespective of the potential at said first storage node of each of said memory cells.

13. The semiconductor memory device according to claim 12, wherein said activating means includes control signal generating means responsive to applying of a drive voltage which drives the semiconductor memory device to the same for generating a control signal for controlling said supplying means to be activated for a predetermined period.

14. The semiconductor memory device according to claim 13, wherein said supplying means includes logical gate means having first and second input ends for receiving the potential at said first storage node of each of said memory cells and said control signal, respectively, and an output end connected to said second storage node of each of said memory cells.

15. The semiconductor memory device according to claim 14, wherein said logical gate means includes a two-input NAND gate, and a logical level of the potential of said control signal is low for said predetermined period.

16. The semiconductor memory device according to claim 14, wherein said logical gate means includes a two-input NOR gate, and a logical level of the potential of said control signal is high for said predetermined period.

17. The semiconductor memory device according to claim 12, wherein said activating means includes first and second control signal generating means responsive to applying a drive voltage for driving the semiconductor memory device to the same for generating first and second control signals having complementary potentials to each other which controls said supplying means to be activated for a predetermined period.

18. The semiconductor memory device according to claim 17, wherein said supplying means includes, a first switching element controlled to be turned on/off in response to the potential at said first storage node of each of said memory cells and provided between said second storage node of each of said memory cells and a first power supply for supplying a first potential, a second switching element controlled to be turned on and off in response to said first control signal and provided between said second storage node of each of said memory cells and said first power supply, and a third switching element controlled to be turned on and off in response to the potential at said first storage node of each of said memory cells ad provided between said second storage node of each of said memory cells and said second control signal generating means, said first switching element and said second switching element being turned on and off complimentarily.

19. The semiconductor memory device according to claim 18, wherein said first switching element includes a first field effect semiconductor element of a first polarity having a control terminal for receiving the potential at said first storage node of each of said memory cells, a first conduction terminal connected to said second storage node of each of said memory cells and a second conduction terminal connected to said first power supply, said second switching element includes a second field effect semiconductor element of said first polarity having a control terminal for receiving said first control signal, a first conduction terminal connected to said second storage node of each of said memory cells ad a second conduction terminal connected to said first power supply, and said third switching element includes a third field effect semiconductor device of a second polarity opposite to said first polarity having a control terminal for receiving the potential at said first storage node of each of said memory cells, a first conduction terminal connected to said second storage node of each of said memory cells and a second conduction terminal for receiving said second control signal.

20. The semiconductor memory device according to claim 19, wherein
said first polarity is of N type, and
a logical level of said first potential is low and a logical level of the potential of said first control signal is high for said predetermined period.

21. The semiconductory memory device according to claim 19, wherein
said first polarity is of P type, and
a logical level of said first potential is high and a logical level of said first control signal is low for said predetermined period.

22. The semiconductor memory device according to claim 10, wherein said plurality of memory cells are arranged in a matrix of a plurality of rows and columns, the semiconductory memory device further comprising:
word lines each provide corresponding to each of said plurality of rows; and
bit line pairs wherein each bit lien pair is provided corresponding to each of said plurality of columns, each of said bit line pairs including a first bit line connected in common to respective ones of said first storage nodes of said memory cells arranged in a corresponding one of said columns and a second bit line connected in common to respective ones of said second storage nodes of said memory cells arranged in a corresponding one of said columns,
each of said plurality of memory cells further including,
a first control switching element provided between said first storage node included int he memory cell and said first bit lien corresponding to said column in which the memory cell is arranged, for controlling a state of electrical connection therebetween and being turned on and off in response to the potential on said word lien corresponding to said row in which the memory cell is arranged, and
a second control switching element provided between said second storage node included in the memory cell and said second bit line corresponding to said column in which the memory cell is arranged, for controlling a state of electrical connection therebetween and being turned on and off in response to the potential on said corresponding word line.

23. The semiconductor memory device according to claim 11, wherein said plurality of memory cells are arranged in a matrix of a plurality of rows and columns, the semiconductor memory device further comprising:
word lines each provided correspond to each of said plurality of rows; and
bit line pairs wherein each bit line pair is provided corresponding to each of said plurality of columns, each of said bit line pairs including a first bit line connected in common to respective ones of said first storage nodes of said memory cells arranged in a corresponding one of said columns and a second bit line connected in common to respective ones of said second storage nodes of said memory cells arranged in a corresponding one of said columns,
each of said plurality of memory cells further including,
a first control switching element provided between said first storage node include int he memory cell and said first bit line corresponding to said column in which the memory cell is arranged, for controlling a state of electrical connection therebetween and being turned on and off in response to the potential on said word line corresponding to said row in which the memory cell is arranged, and
a second control switching element provided between said second storage node included int he memory cell and said second bit line corresponding to said column in which the memory cell is arranged, for controlling a state of electrical connection therebetween and being turned on and off in response to the potential on said corresponding word line.

24. The semiconductor memory device according to claim 12, wherein said plurality of memory cells are arranged in a matrix of a plurality of rows and columns, the semiconductor memory device further comprising:
word lines each provided corresponding to each of said plurality of rows, and
bit line pairs wherein each bit line pair is provided corresponding to each of said plurality of columns, each of said bit line pairs including a first bit line connected in common to respective ones of said first storage nodes of said memory cells arranged in a corresponding one of said columns and a second bit line connected in common to respective one of said second storage nodes of said memory cells arranged in a corresponding one of said columns,
each of said plurality of memory cells further including,
a first control switching element provided between said first storage node included in the memory cell and said first bit lien corresponding to said column in which the memory cell is arranged, for controlling a state of electrical connection therebetween and being turned on and off in response to the potential on said word line corresponding to said row in which the memory cell is arranged, and
a second control switching element provided between said second storage node included int he memory cell and said second bit line corresponding to said column in which the memory ell is arranged, for controlling a state of electrical connection therebetween and being turned on and off in response to the potential on said corresponding word line.

25. The semiconductor memory device according to claim 1, wherein said plurality of memory cells are arranged in a matrix of a plurality of rows and columns, the semiconductor memory device further comprising:
word lines each provided corresponding to each of said plurality of rows, and
bit lines each provided corresponding to each of said plurality of columns,
each of said plurality of memory cells including,
a first switching element provided between said bit line corresponding to a column in which the memory cell is arranged and said storage node location included in said column and being controlled to be turned on and off in response to the potential on a word line corresponding to a row in which the memory cell is arranged, and
a capacitive coupling element provided between said storage node location included in the memory cell and a low potential source ad being charged and discharged in response to the potential on said corresponding bit line when said first switching element is turned on.

26. The semiconductor memory device according to claim 25, wherein said potential forcing meas includes a second switching element connected to said storage node location of a corresponding one of said predetermined memory cells for charging and discharging said capacitive coupling element irrespective of the potential on the corresponding bit line.

27. The semiconductor memory device according to claim 26, wherein said activating means includes first control signal generating means responsive to applying a drive voltage which drives the semiconductor memory device to the same for generating a first control signal which controls said second switching element to turn on the same for a fixed time period.

28. The semiconductor memory device according to claim 27, wherein said second switching element includes a field effect semiconductor element having a control terminal and a first conduction terminal for receiving said control signal and a second conduction terminal connected to said storage node location of each of said memory cells.

29. The semiconductor memory device according to claim 27, wherein said second switching element includes a field effect semiconductor element having a control terminal for receiving said control signal, a first conduction terminal connected to said low potential source and a second conduction terminal connected to said storage node of each of said memory cells.

30. The semiconductor memory device according to claim 27, wherein said activating means further includes second control signal generating means for generating a second control signal having a complementary potential to said first control signal.

31. The semiconductor memory device according to claim 30, wherein said second switching element includes a field effect semiconductor element having a control terminal for receiving said first control signal, a first conduction terminal for receiving said second control signal and a second conduction terminal connected to said storage node location of each of said memory cells.

32. The semiconductor memory device according to claim 28, wherein
the polarity of said field effect semiconductor element is of N type, and
a logical level of the potential of said first control signal is high for said fixed time period.

33. The semiconductor memory device according to claim 31, wherein
the polarity of said field effect semiconductor element is of P type, and
a logical level of the potential of said first control signal is low for said fixed time period.

34. The semiconductor memory device according to claim 8, wherein
said first polarity and said second polarity are the same, and
the potential of said first control signal and the potential of said second control signal are the same.

35. The semiconductor memory device according to claim 8, wherein
said first polarity and said second polarity are opposite to each other, and
the potential of said first control signal and the potential of said second control signal are complementary to each other.

36. A semiconductor memory device for initializing storage data, comprising:

a plurality of memory cells each having a storage node to be maintained to a potential corresponding to storage data and provided in a matrix of a plurality of rows and columns;
word lines each provided corresponding to each of said plurality of rows;
bit lines each provided corresponding to each of said plurality of columns;
potential forcing means provided corresponding to each of predetermined memory cells out of said plurality of memory cells responsive to predetermined initialization data for initializing and forcing the potential at said storage node of a corresponding one of said predetermined memory cells to the potential corresponding to said predetermined initialization data; and
activating means for activating said potential forcing means all at once corresponding to each of said predetermined memory cells in response to a power supply immediately after the activation of said power supply and initializing said plurality of memory cells every time that a control signal is activated for a predetermined time period so that the time required for initialization is constant irrespective of the number of memory cells to be initialized.

37. A method for initializing storage data in a conductor memory device comprising the steps of:
(a) maintaining a plurality of memory cells each having a storage node location at a potential corresponding to the storage data;
(b) developing predetermined initialization data by potential forcing means each provided corresponding to each of predetermined memory cells out of said plurality of memory cells for initializing and forcing the potential of said storage node location of the corresponding one of said predetermined memory cells to the potential corresponding to said predetermined initialization data; and
(c) activating said potential forcing means all at once corresponding to each of said predetermined memory cells in response to a power supply immediately after the activation of said power supply and initializing said plurality of memory cells every time that a control signal is activated for a predetermined time period so that the time required for initialization is constant irrespective of the number of memory cells to be initialized.

38. The method according to claim 37, wherein said step (a) further includes the step of maintaining first and second storage nodes of said storage node location at potentials complementary to each other when initializing the storage data.

39. The method according to claim 38, further comprising the steps of:
supplying a first potential by a first power supply; and
supplying a second potential by a second power supply complementary to said first potential.

40. The method according to claim 39, wherein said step (c) further includes the step of generating first and second control signals which control a first switching element provided between said first storage node and said first power supply and a second switching element provided between said second storage node and said second power supply of each of said plurality of memory cells, respectively, and turns on said first and second switching elements for a predetermined time period in response to applying a drive voltage for driving the semiconductor memory device to the same.

41. The method according to claim 40, further including the steps of:

receiving said first control signal by said first switching element including a first field effect semiconductor element of a first polarity having a control terminal for receiving said first control signal, a first conduction terminal connected to said first storage node of each of said memory cells and a second conduction terminal connected to said first power supply, and receiving said second control signal by said second switching element including a second field effect semiconductor element of a second polarity having a conduction terminal for receiving said second control signal, a first conduction terminal connected to said second storage node of each of said memory cells and a second conduction terminal connected to said second power supply.

42. The method according to claim 41, wherein said first polarity and said second polarity are opposite to each other and the potential of said first control signal the potential of the second control signal are complementary to each other.

43. The method according to claim 40, further including the steps of, receiving said first control signal by said first switching element including a first field effect semiconductor element of a first polarity having a control terminal receiving said first control signal, a first conduction terminal connected to said first storage node of each of said memory cells and a second conduction terminal for receiving said second control signal, and receiving said second control signal by said second switching element of a second polarity opposite to said first polarity having a control terminal for receiving said second control signal, a first conduction terminal connected to said second storage node of each of said memory cells and a second conduction terminal for receiving said first control signal, wherein the potential of said first control signal and the potential of said second control signal in said predetermined time period are equal to said first potential and said second potential, respectively.

44. The method according to claim 37, wherein said plurality of memory cells are arranged in a matrix of a plurality of rows and columns and the semiconductor memory device further comprises word lines each provided corresponding to each of said plurality of rows and bit lines each provided corresponding to each of said plurality of columns and further include the steps of, controlling each of said plurality of memory cells to be turned on and off by a first switching element provided between said bit line corresponding to a column in which the memory cell is arranged and said storage node location included in said column in response to the potential on a word line corresponding to a row in which the memory cell is arranged, and charging and discharging each of said plurality of memory cells by a capacitive coupling element provided between said storage node location included in the memory cell and a low potential source in response to the potential on said corresponding bit line when said first switching element is turned on.

45. The method according to claim 44, wherein said step (b) further includes the step of charging and discharging said capacitive coupling element by a second switching element connected to said storage node location of a corresponding one of said predetermined memory cells irrespective of the potential on the corresponding bit line.

46. The method according to claim 45, wherein said step (c) further includes the step of generating a first control signal which controls said second switching element to turn on the same for a fixed time period by first control signal generating means responsive to applying a drive signal which drives the semiconductor memory device to the same.

47. The method according to claim 46, wherein said step (c) further includes the step of generating a second control signal having a complementary potential to said first control signal by second control signal generating means.

48. The method according to claim 47, further including the step of receiving said first control signal by said second switching element including a field effect semiconductor element having a control terminal for receiving said first control signal, a first conduction terminal for receiving said second control signal and a second conduction terminal connected to said storage node location of each of said memory cells.

49. The method according to claim 48, wherein the potential of said field effect semiconductor device is of a type and a logical level of the potential of said first control signal is low for said fixed time period.

* * * * *